United States Patent
Hur et al.

(10) Patent No.: US 7,979,758 B2
(45) Date of Patent: Jul. 12, 2011

(54) SEMICONDUCTOR MEMORY DEVICE

(75) Inventors: Hwang Hur, Kyoungki-do (KR); Chang-Ho Do, Kyoungki-do (KR); Jae-Bum Ko, Kyoungki-do (KR); Jin-Il Chung, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 405 days.

(21) Appl. No.: 12/154,870

(22) Filed: May 28, 2008

(65) Prior Publication Data
US 2009/0219775 A1 Sep. 3, 2009

(30) Foreign Application Priority Data

Feb. 29, 2008 (KR) .................. 10-2008-0018761

(51) Int. Cl.
*G11C 29/00* (2006.01)
*G01R 31/28* (2006.01)
(52) U.S. Cl. .................... 714/718; 714/733; 714/738
(58) Field of Classification Search .................. 714/733, 714/734, 718, 738, 736, 699, 754, 30; 324/763, 324/760, 765, 200, 201
See application file for complete search history.

(56) References Cited

U.S. PATENT DOCUMENTS

| | | | | |
|---|---|---|---|---|
| 6,190,972 B1 * | 2/2001 | Zheng et al. | ................... | 438/275 |
| 6,823,485 B1 * | 11/2004 | Muranaka | ..................... | 714/719 |
| 6,829,737 B1 * | 12/2004 | McBride | ........................ | 714/718 |
| 6,943,575 B2 * | 9/2005 | Marr | .............................. | 324/765 |
| 7,119,568 B2 * | 10/2006 | Marr | .............................. | 324/763 |
| 7,392,443 B2 * | 6/2008 | Braun | ........................... | 714/718 |
| 2007/0018677 A1 * | 1/2007 | Marr | .............................. | 324/765 |

FOREIGN PATENT DOCUMENTS

| | | |
|---|---|---|
| KR | 1995-0014097 B1 | 11/1995 |
| KR | 2001-0067326 A | 7/2001 |
| KR | 10-2005-0021932 A | 3/2005 |

* cited by examiner

*Primary Examiner* — Phung M Chung
(74) *Attorney, Agent, or Firm* — Blakely, Sokoloff, Taylor & Zafman

(57) ABSTRACT

Semiconductor memory device includes a cell array including a plurality of unit cells; and a test circuit configured to perform a built-in self-stress (BISS) test for detecting a defect by performing a plurality of internal operations including a write operation through an access to the unit cells using a plurality of patterns during a test procedure carried out at a wafer-level.

12 Claims, 18 Drawing Sheets

SEMICONDUCTOR MEMORY DEVICE

CROSS-REFERENCE TO RELATED APPLICATIONS

The present invention claims priority of Korean patent application number 10-2008-0018761, filed on Feb. 29, 2008, which is incorporated by reference in its entirety.

BACKGROUND OF THE INVENTION

The present invention relates to a semiconductor memory device, and more particularly, to a semiconductor memory device that reduces a test time for operation of the semiconductor memory device with high capacity, and a testing method of the semiconductor memory device.

In a system with a variety of semiconductor devices, a semiconductor memory device serves as a data storage. The semiconductor memory device outputs data according to addresses received from a data processor, e.g., a central processing unit (CPU), or stores data received from the data processor into memory cells selected by addresses.

As the operating speed of the system increases and semiconductor integrated circuit technologies are advanced, semiconductor memory devices are required to input and output data at higher speed. In order for faster and stable operation of semiconductor memory devices, a variety of circuits inside the semiconductor memory devices must be able to operate at a high speed and transfer signals or data between the circuits at a high speed. This causes a design and fabrication of a semiconductor memory device to be complex, and also causes a testing process of the fabricated semiconductor memory device to be complex and difficult. More specifically, the number of operations to be tested increases, and a testing procedure for each operation is also complicated. The testing process of a semiconductor memory device with high capacity and integration degree requires a complex algorithm and much test time due to its complexity. Accordingly, it takes a long time to test a semiconductor memory device using a method of accessing the semiconductor memory device from the outside and testing it by an automatic test equipment (ATE), which has been typically used. Consequently, this typical method leads to a decrease in productivity of a semiconductor memory device as well as test efficiency.

Therefore, there is increasing difficulty in mass-producing a semiconductor memory device, and thus many attempts have been made to prevent a decrease in productivity. To overcome such a difficulty, new testing methods, which can replace a typical testing process of requiring a long test time, have been proposed to reduce a test time and cost. For example, one of new testing methods is a test during burn-in (TDBI) process performed after packaging a semiconductor memory device. The TDBI process is a test process of applying a stress to determine whether there is a defect or not by repeating a write operation of a simple pattern on the semiconductor memory device that is packaged. Specifically, the TDBI process is a test process of applying a stress to the semiconductor memory device by performing a write operation of a simple pattern for a long time (maximally, several hours) at a relatively high temperature (maximally, approximately 100° C.) under a relatively high voltage after a packaging process. Since the TDBI process is performed at a package level, excessive current consumption sometimes causes package balls to be melted to thereby damage a test equipment including a probe card, leading to an increase in test cost. Accordingly, a typical semiconductor memory device should be operated within a range so as to consume the amount of current not exceeding a predetermined amount.

In this way, to prevent the package from being damaged due to overcurrent during TDBI process, semiconductor memory devices to be simultaneously tested should be limited in number, and word lines to be simultaneously enabled in each semiconductor memory device through one-time active command is also limited in number. Resultingly, most of time to be taken for a subsequent process is used in the TDBI process, and thus it is possible to disperse various tests for a semiconductor memory device. However, the TDBI process is not effective to reduce a test time notably.

To test a semiconductor memory device more effectively before packaging, a testing method has been proposed where a built-in self-test (BIST) circuit is built in the semiconductor memory device. In addition, to increase yield of a semiconductor memory device, another testing method has been introduced where a built-in self-repair (BISR) is built in the semiconductor memory device so as to repair defects detected through a wafer level burn-in (WBI) test, and this method is increasingly applied to various fields. Herein, The BISR of the semiconductor memory device is accompanied with a variety of mechanisms such as built-in self-diagnostics (BISD), built-in redundancy analysis (BIRA) as well as BIST.

This BIST suggested an alternative to solve problems, e.g., limitation in channel, in the case of a testing process using a conventional ATE. Since a test control circuit, which is capable of realizing a memory test algorithm, is built in the BIST circuit, a great number of ports for a channel to be connected to an external test equipment are not required, and operation of the semiconductor memory device can be tested at a high speed. The conventional BIST determines whether there is a defect or not, in such a way that commands, addresses and data are generated according to a test pattern, then written to a unit cell, and read out through a comparator. If there is a defect, the conventional BIST determines whether the defect can be repaired using a redundancy circuit.

However, a defect may occur in a unit cell of a semiconductor memory device in various circumstances besides read and write operations. If a variety of test patterns and algorithms are incorporated in an internal circuit for BIST in consideration of such various circumstances, a total area of the semiconductor memory device may be unfavorably increased. Therefore, a testing process as to whether defects may occur in various operating circumstances is performed in a TDBI process after fabrication of a semiconductor memory device package. As described above, however, there is a disadvantage in that it takes a long time to test a semiconductor memory device in a TDBI process.

SUMMARY OF THE INVENTION

Embodiments of the present invention are directed to providing a semiconductor memory device with a built-in self-test (BIST) circuit for performing a test according to various patterns at a wafer-level so as to reduce or eliminate a test time for operation of a semiconductor memory device after packaging.

In accordance with an aspect of the present invention, there is provided a cell array including a plurality of unit cells; and a test circuit configured to perform a built-in self-stress (BISS) test for detecting a defect by performing a plurality of internal operations including a write operation through an access to the unit cells using a plurality of patterns during a test procedure carried out at a wafer-level.

In accordance with an aspect of the present invention, there is provided a method of testing a semiconductor memory device, the method comprises a step of entering a test mode in response to an external signal at a wafer-level, determining whether to perform a BISS test using a test code applied through a specific address pad, outputting an address control signal and a command control signal for a multi-pattern test including a row pattern test and a column pattern test, when the BISS is performed, generating a row address, a column address and a bank address for accessing a unit cell in a cell array in response to the address control signal, generating an internal test command and a test data in response to the command control signal and performing the BISS in response to the row address, the column address, the bank address, the internal test command and the test data.

DESCRIPTION OF SPECIFIC EMBODIMENTS

Hereinafter, a semiconductor memory device in accordance with the present invention will be described in detail with reference to the accompanying drawings.

A wafer burn-in (WBI) mode is a test mode of detecting defects by applying a DC voltage to a word line or a bit line in a relatively short time (maximally, a few of seconds). In accordance with the present invention, however, even in a WBI mode performed at a wafer-level, it is possible to perform a built-in self-stress (BISS) test allowing a semiconductor memory device to be operated similarly to a test pattern carried out in a test during burn-in (TDBI) process. Unlike the case where a variety of test patterns and algorithms are implemented through a plurality of pads, a WBI mode test for detecting defects is performed using only a small number of pads generally. However, in the present invention, the BISS test for various tests is performed by implementing an algorithm and a test pattern performed in the TDBI process, using a channel of a test equipment that is not used in the WBI mode and a test code that may be input through a plurality of pads of a semiconductor memory device.

Figure 1:
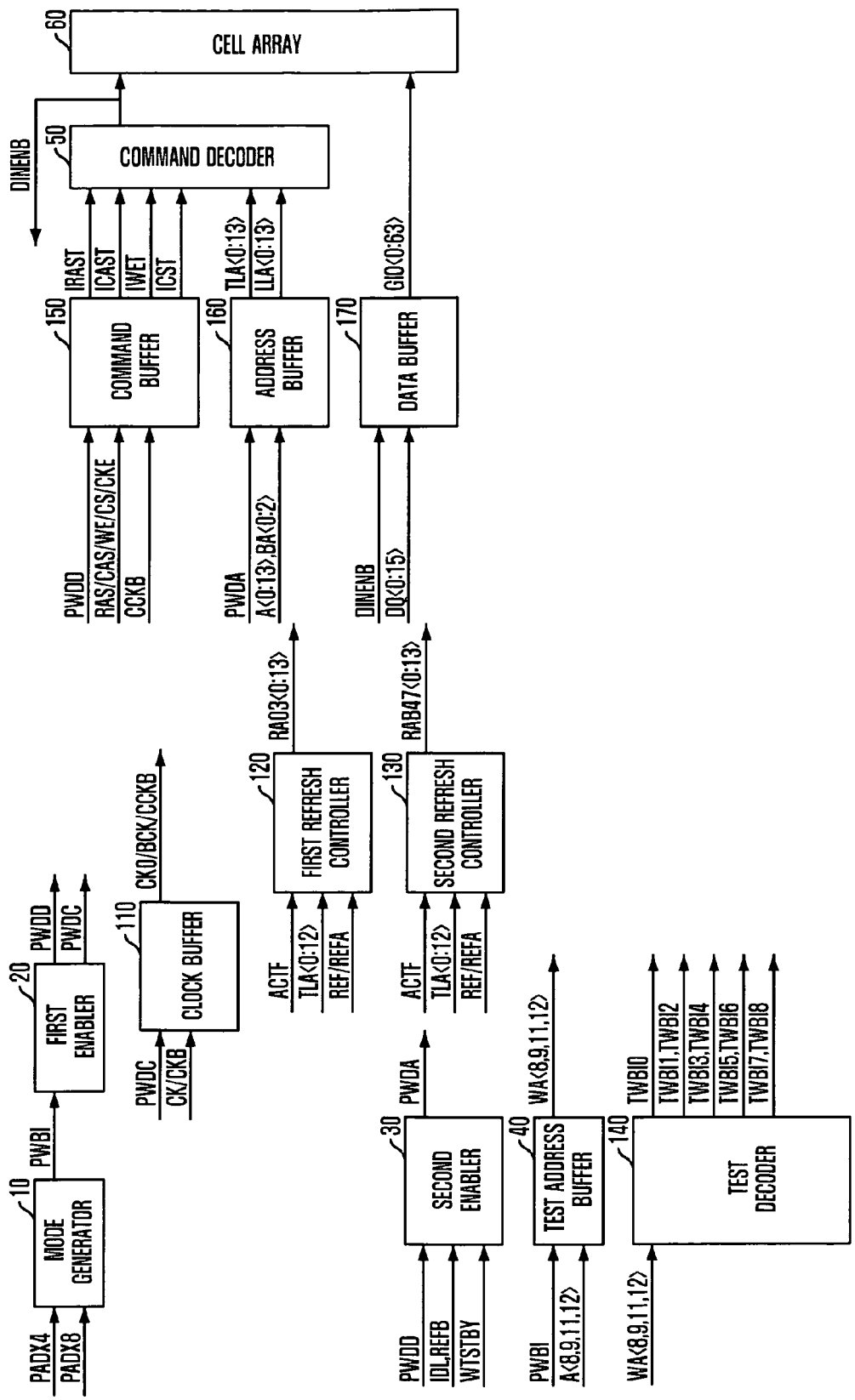
FIG. 1 is a block diagram of a semiconductor memory device.

FIG. 1 is a block diagram of a semiconductor memory device.

Referring to FIG. 1, the semiconductor memory device includes a mode generator 10, a first enabler 20, a second enabler 30, a test address buffer 40, a command decoder 50, a cell array 60, a clock buffer 110, a first refresh controller 120, a second refresh controller 130, a test decoder 140, a command buffer 150, an address buffer 160, and a data buffer 170.

The mode generator 10 informs that the semiconductor memory device enters a test mode through a signal input through a specific pad. That is, the mode generator 10 activates a wafer burn-in flag signal PWBI when both signals input through two specific pads ('X4' and 'X8') are at logic high level. When the wafer burn-in flag signal PWBI is activated, the first enabler 20 generates a command enable signal PWDD for enabling the command buffer 150, and a clock enable signal PWDC for enabling the clock buffer 110. Here, the command buffer 150 enabled by the command enable signal PWDD changes command signals RAS, CAS, WE, CS and CKE related to read or write operation, which are received via external command pads, into internal command signals IRAST, ICAST, IWET and ICST in response to an output CCKB of the clock buffer 110. The clock buffer 110 enabled by the clock enable signal PWDC changes clock signals CK and CKB input via external clock pads into internal clocks CKO, BCK and CCKB.

When the command enable signal PWDD output from the first enabler 20 is activated, the second enabler 30 generates an address enable signal PWDA for enabling the address buffer 160 in response to internal operation control signals IDL, REFB and WTSTBY. The internal operation control signal input to the second enabler 30 includes an idle signal IDL signifying an idle state, a refresh related control signal REFB, and a control signal WTSTBY for maintaining a stand-by state for a predetermined time during write operation. When the address enable signal PWDA is activated, the address buffer 160 transfers signals received from address pads A<0:13> and BA<0:2> to the command decoder 50.

The command decoder 50 receives the internal command signals IRAST, ICAST, IWET and ICST output from the command buffer 150 and internal address signals TLA<0:13> and LLA<0:13> output from the address buffer 160 to access unit cells in the cell array 60. At the same time, the command decoder 50 generates a data enable signal DINENB for enabling the data buffer 170 such that data input from the outside are transferred inside. The data buffer 170 transfers data input via a plurality of data pads DQ<0:15> to global input/output (I/O) lines GIO<0:63> in response to the data enable signal DINENB.

When the wafer burn-in flag signal PWBI is activated, the test address buffer 40, which is used in only a test at a wafer-level, buffers signals input through specific address pads A<8, 9, 11, 12> to output test operation codes WA<8, 9, 11, 12>. The test decoder 140 receives the test operation codes WA<8, 9, 11, 12>, and decodes the test operation codes WA<8, 9, 11, 12> to generate a plurality of test internal control signals TWBI0 to TWBI8 used for controlling test operation. The plurality of test internal control signals TWBI0 to TWBI8 are used to control internal operation instead of general operations, for example, read operation, write operation or refresh operation of a semiconductor memory device. The activation/deactivation of the test internal control signals TWBI0 to TWBI8 is determined depending on a value input through the specific address pads A<8,9,11,12> during a test.

The cell array 60 of the semiconductor memory device includes a plurality of banks. The first and second refresh controllers 120 and 130 enable word lines in the plurality of banks in response to the internal address signals TLA<0:12> transferred from the address buffer 160 when an active command ACTF, a refresh command REF or an auto-refresh command REFA is activated. Assuming that the semiconductor memory device includes eight banks, the first refresh controller 120 controls word lines in first to fourth banks, and the second refresh controller 130 controls word lines in fifth to eighth banks.

Figure 2A:
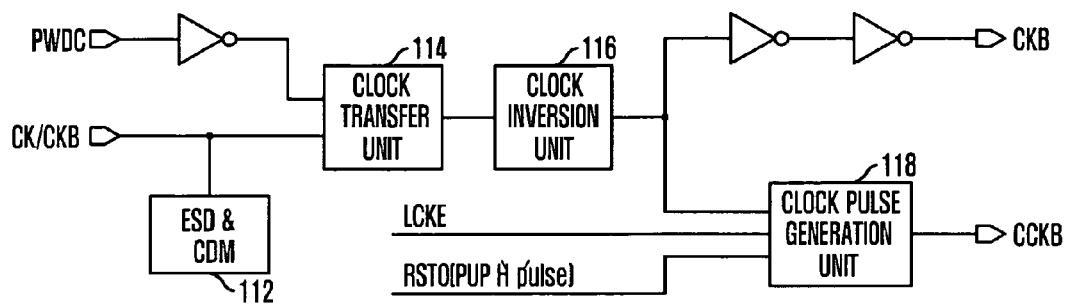
FIG. 2A is block diagram of a clock buffer in FIG. 1.

FIG. 2A is block diagram of the clock buffer 110 in FIG. 1.

Referring to FIG. 2A, the clock buffer 110 includes a signal distortion prevention unit 112, a clock transfer unit 114, a clock inversion unit 116, and a clock pulse generation unit 118.

The signal distortion prevention unit 112 prevents a signal distortion caused by electrostatic discharge (ESD). Herein, the ESD is a phenomenon that charges are rapidly discharged in 200 ns or less when an electrically charged object contacts another object having a different potential. In a semiconductor memory device with high-frequency performance, the ESD may occur due to a property difference between an external material and an internal material while a signal transferred through an external line is transferred inside via input/output (I/O) pads. In general, the signal distortion due to ESD may be explained using three models, i.e., a charge device model (CDM), a human body model (HBM), and a field induced model (FIM). Among these three models, since the signal distortion caused by CDM is most serious in the semiconductor memory device, the signal distortion prevention unit 112 is required to prevent the signal distortion.

The clock transfer unit 114 receives the clock signals CK and CKB input via the signal distortion prevention unit 112 to determine whether to transfer the clock signals CK and CKB to the clock inversion unit 116 in response to the clock enable signal PWDC output from the first enabler 20. Typically, the clock transfer unit 114 is designed by applying a differential amplifier, and controls the flow of a bias current according to the clock enable signal PWDC. A signal transferred from the clock transfer unit 114 is inverted through the clock inversion unit 116 to have the same logic level as an original input signal. An output signal of the clock inversion unit 116 is buffered and then output as a first internal clock CKO.

The clock buffer 110 further includes the clock pulse generation unit 118. The clock pulse generation unit 118 outputs a command valid pulse CCKB which allows the command buffer 350 to change the command signals RAS, CAS, WE, CS and CKE input from the outside into the internal command signals IRAST, ICAST, IWET and ICST and to maintain their states for a predetermined time. Herein, the command valid pulse CCKB, which is used to maintain the internal command signals IRAST, ICAST, IWET and ICST for a predetermined time required for internal operation, determines an activation period according to the command enable signal PWDC and the reset signal RSTO output from the first enabler 20.

Figure 2B:
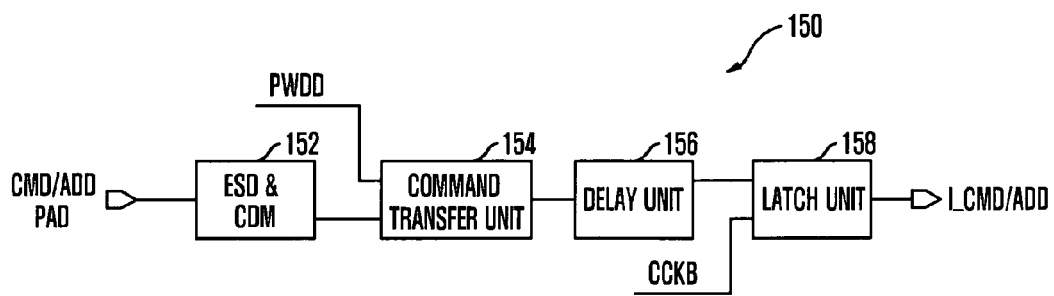
FIG. 2B is block diagram of a command buffer in FIG. 1.

FIG. 2B is block diagram of the command buffer 150 in FIG. 1.

Referring to FIG. 2B, the command buffer 150 includes a distortion prevention unit 152, a command transfer unit 154, a delay unit 156, and a latch unit 158.

The distortion prevention unit 152 of the command buffer 150 is configured to prevent distortion of the command signals RAS, CAS, WE, CS and CKE applied from the outside, which is similar to the signal distortion prevention unit 112 illustrated in FIG. 2A. Therefore, further description for the distortion prevention unit 152 will be omitted herein. The command transfer unit 154 is also similar to the clock transfer unit 114 of the clock buffer 110, but differs from the clock transfer unit 114 of the clock buffer 110 in that it determines the transfer of the command signals RAS, CAS, WE, CS and CKE according to the command enable signal PWDD output from the first enabler 20. An operation timing of a command is adjusted while the output of the command transfer unit 154 is buffered through the delay unit 156. The latch unit 158 maintains logic levels of the internal command signals IRAST, ICAST, IWET and ICST according to the command valid pulse CCKB output from the clock buffer 110.

Figure 2C:
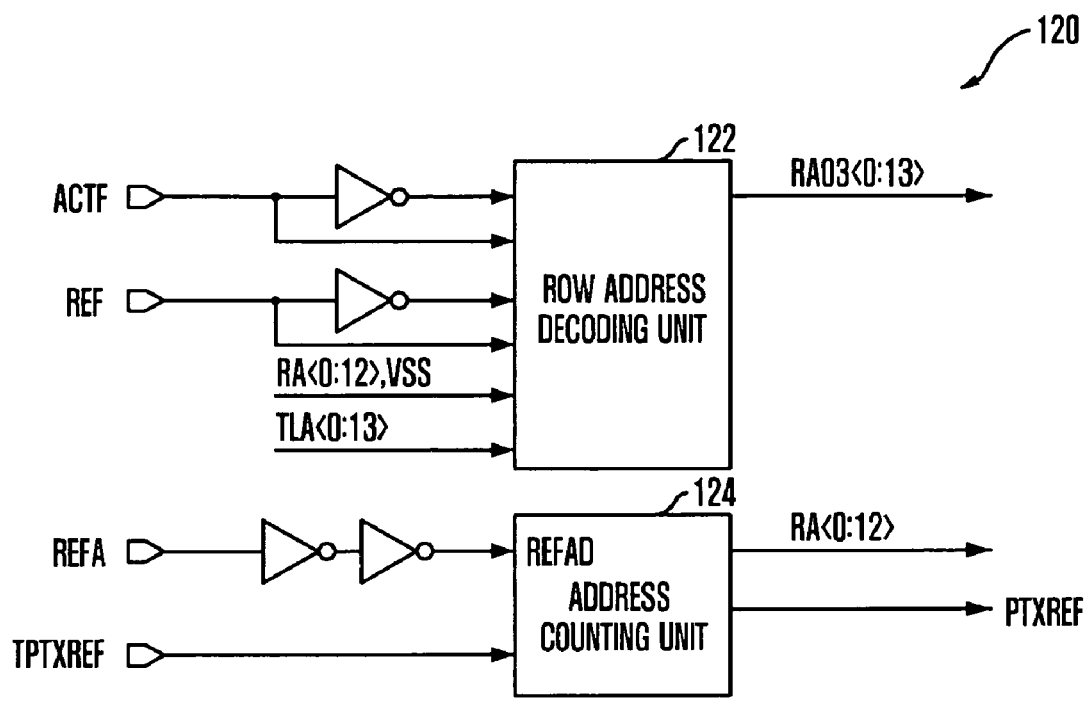
FIG. 2C is a block diagram of a first refresh controller in FIG. 1.

FIG. 2C is a block diagram of the first refresh controller 120 in FIG. 1.

Referring to FIG. 2C, the first refresh controller 120 includes a row address decoding unit 122, and an address counting unit 124. The row address decoding unit 122 decodes the internal address signals RA<0:12> and TLA<0:13> that are input at a timing when the active command ACTF or the refresh command REF is activated, thereby outputting resultant signals RA<0:13> for enabling corresponding word lines. The address counting unit 124 sequentially enables word lines in the first to fourth banks when the auto-refresh command REFA or a test refresh signal TPTXREF is activated. In particular, when the activated rest refresh signal TPTXREF is input, a word line of a redundancy circuit is also enabled during test. To this end, the address counting unit 124 separately receives redundancy addresses RA<0:6, 12:13> to enable the word line in the redundancy circuit selected by a specific address when the test refresh signal TPTXREF is activated.

Figure 2D:
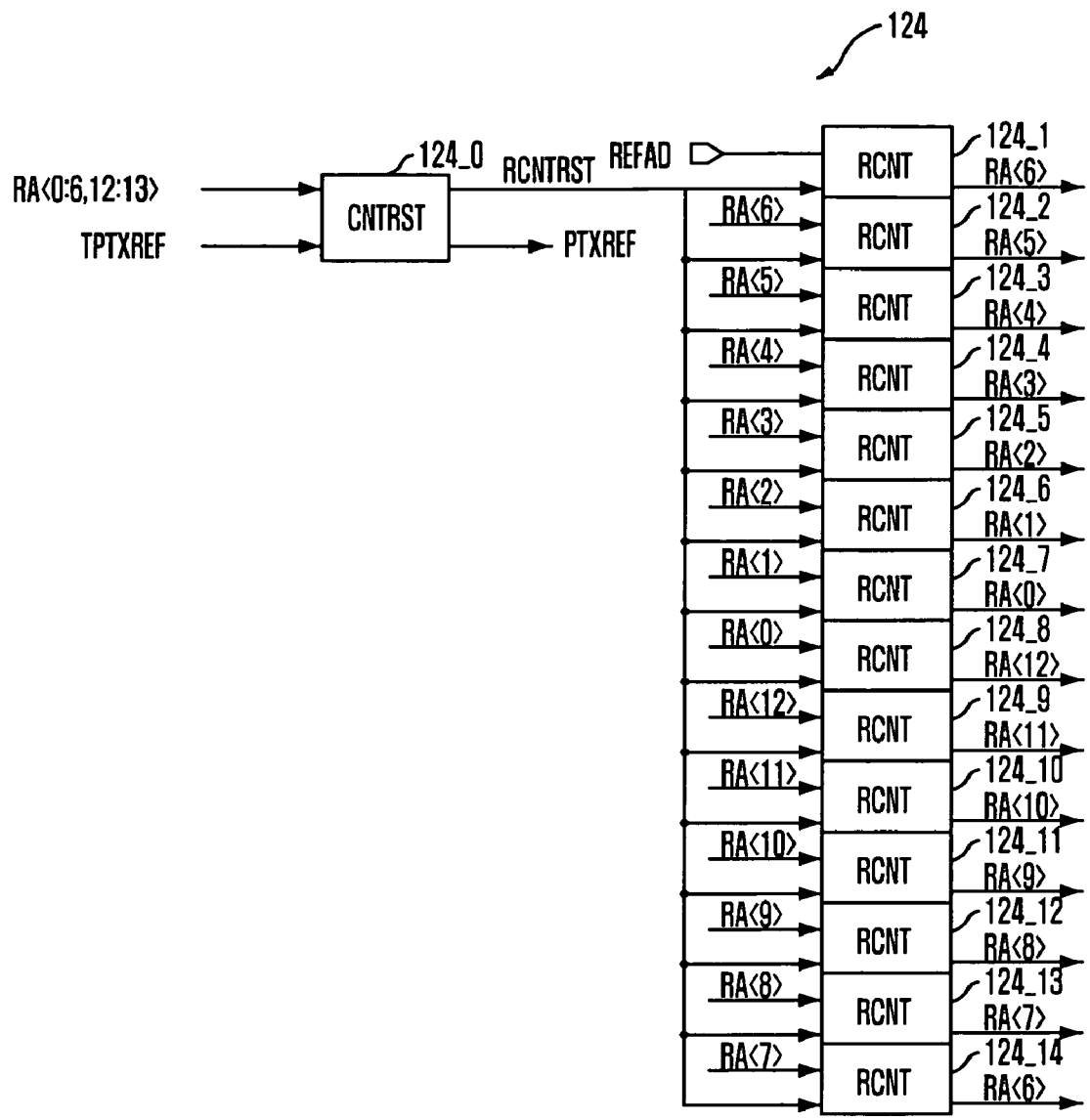
FIG. 2D is a circuit diagram of an address counting unit in FIG. 2C.

FIG. 2D is a circuit diagram of the address counting unit 124 in FIG. 2C.

Referring to FIG. 2D, the address counting unit 124 includes a plurality of unit counters 124_1 to 124_14 configured to sequentially enable the word lines in the first to fourth banks, a counter reset unit 124_0 configured to reset the plurality of unit counters 124_1 to 124_14 and to refresh the redundancy circuit in response to the test refresh signal TPTXREF.

As for specific operation of the address counting unit 124, the plurality of unit counters 124_1 to 124_14 receiving a buffered signal REFAD of the auto-refresh command REFA output row addresses RA03<0:13> for sequentially enabling the word lines in the first to fourth banks. In contrast, the counter reset unit 124_0 resets the plurality of unit counters 124_1 to 124_14 when the test refresh signal TPTXREF is activated. In addition, the counter reset unit 124_0 outputs a redundancy refresh signal PTXREF for enabling the word line in the redundancy circuit according to the redundancy addresses RA<0:6, 12:13> used to replace specific addresses.

The above-described semiconductor memory device can perform a test process on a plurality of unit cells in the cell array 60 using the test address buffer 40 and the test decoder 140 for performing the test in the WBI mode that is a test process carried out at a wafer-level. The semiconductor memory device of FIG. 1, however, cannot internally generate a test pattern carried out in the TDBI process so that it is difficult to perform a test process at a wafer-level. To improve such a difficulty, another semiconductor memory device is proposed below.

Figure 3:
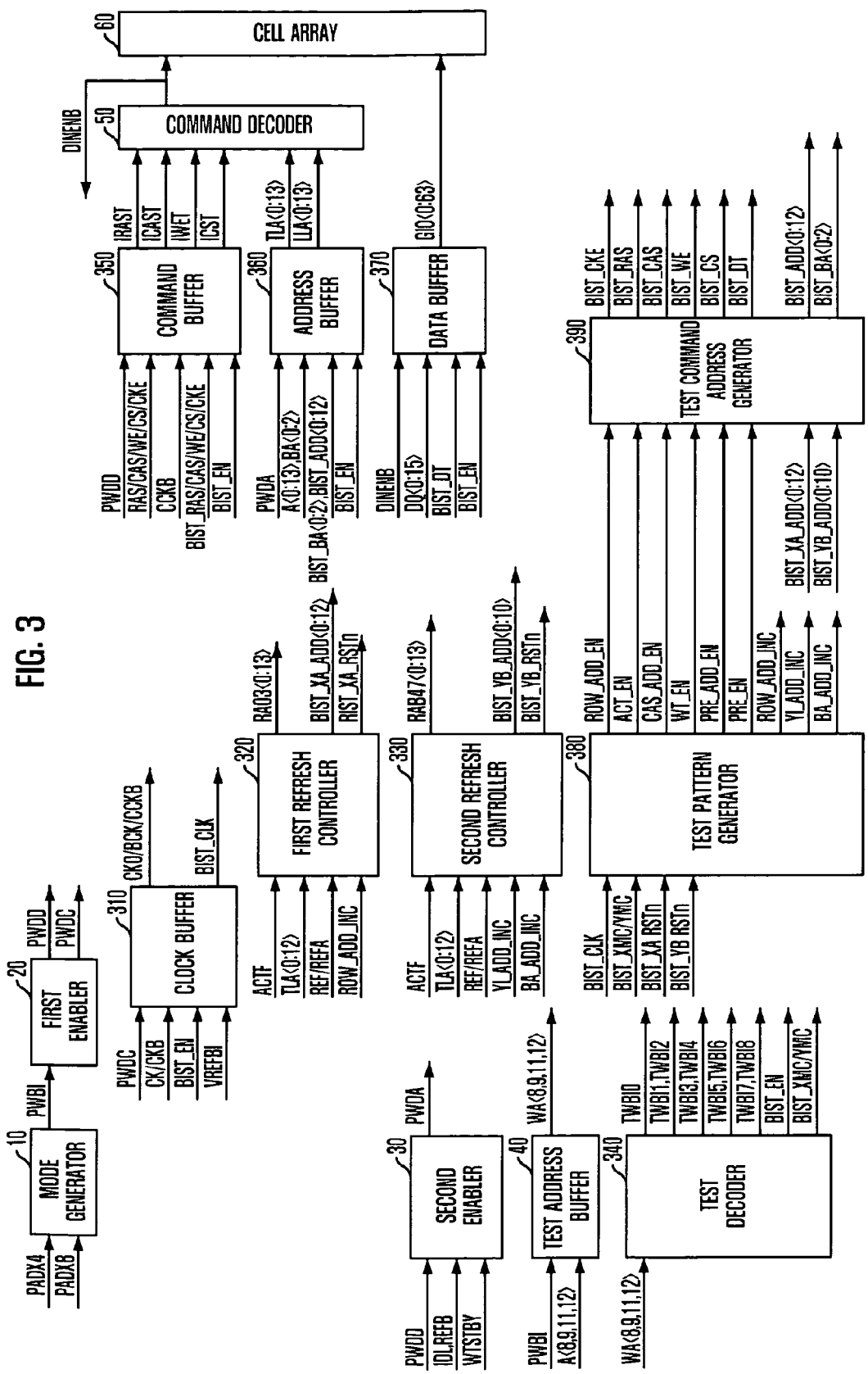
FIG. 3 is a block diagram of a semiconductor memory device in accordance with an embodiment of the present invention.

FIG. 3 is a block diagram of a semiconductor memory device in accordance with an embodiment of the present invention.

Referring to FIG. 3, the semiconductor memory device in accordance with the embodiment of the present invention includes a mode generator 10, a first enabler 20, a second enabler 30, a test address buffer 40, a command decoder 50, a cell array 60, a clock buffer 310, a first refresh controller 320, a second refresh controller 330, a test decoder 340, a command buffer 350, an address buffer 360, a data buffer 370, a test pattern generator 380, and a test command address generator 390. Herein, description for the mode generator 10, the first enabler 20, the second enabler 30, the test address buffer 40, the command decoder 50 and the cell array 60 have been made in FIG. 1, and thus further description will be omitted herein.

Herein, the first and second refresh controllers 320 and 330 has an additional function of counting a row address, a column address and a bank address to perform a BISS test when compared to the first and second refresh controllers 120 and 130 of FIG. 1. Likewise, when compared to the command buffer 150, the address buffer 160 and the data buffer 170 of FIG. 1, the command buffer 350, the address buffer 360 and the data buffer 370, which are activated by a pattern test enable signal BIST_EN during the BISS test, have additional functions of receiving test bank addresses BIST_BA<0:2> and test internal commands BIST_CKE, BIST_RAS, BIST_CAS, BIST_WE, BIST_CS and BIST_DIN for performing the BISS test to transfer them to the command decoder 50, and also have an additional function of transferring test data to the global I/O lines GIO<0:63>.

Unlike the test decoder 140 of FIG. 1, the test decoder 340 decodes the test operation codes WA<8,9,11,12> output from the test address buffer 40 to output first and second pattern test signals BIST_XMC and BIST_YMC and the pattern test enable signal BIST_EN for testing the BISS test as well as a plurality of test internal control signals TWBI0 to TWBI8 for controlling the test operation. Here, the plurality of test internal control signals TWBI0 to TWBI8 are used to control internal operation instead of general operations, for example, read operation, write operation or refresh operation of a semiconductor memory device. The activation/deactivation of the test internal control signals TWBI0 to TWBI8 is determined depending on a value input through the specific address pads A<8,9,11,12> during a test.

The clock buffer 310 receives a master clock for the BISS test through a first clock pad that is provided for transferring a clock signal CK input from the outside, and receives a reference voltage VREFBI sustaining half the power supply voltage (VDD) through a second clock pad that is provided for transferring an inverted clock signal CKB input from the outside. The clock buffer 310 transfers the clock signal CK from the first clock pad and the reference voltage VREFBI from the second clock pad to the inside thereof through a differential amplifier, thereby outputting an internal test clock BIST_CLK in response to the pattern test enable signal BIST_EN.

The test pattern generator 380 generates a row pattern and a column pattern for a test in response to the first and second pattern test signals BIST_XMC and BIST_YMC by the use of the internal test clock BIST_CLK output from the clock buffer 310. A row address enable signal ROW_ADD_EN of a plurality of control signals output from the test pattern generator 380 allows test row addresses BIST_XA_ADD<0:12> output from the first refresh controller 320 to be input as test addresses BIST_ADD<0:12> of the address buffer 360. In contrast, a column address enable signal CAS_ADD_EN output from the test pattern generator 380 allows test column addresses BIST_YB_ADD<0:12> output from the second refresh controller 330 to be input as the test addresses BIST_ADD<0:12> of the address buffer 360. In addition, the test pattern generator 380 outputs an active enable signal ACT_EN for performing active operation in the BISS test, and a write enable signal WT_EN for performing write operation.

To perform precharge operation during the BISS test, the test pattern generator 380 outputs a precharge address enable signal PRE_ADD_EN designating a location where the precharge operation will be performed, and a precharge enable signal PRE_EN for enabling the precharge operation. In particular, the precharge address enable signal PRE_ADD_EN allows the test row addresses BIST_XA_ADD<0:10> output from the first refresh controller 320 to be input as the test addresses BIST_ADD<0:12> of the address buffer 360.

Further, the test pattern generator 380 outputs a row address increment signal ROW_ADD_INC, a column address increment signal YI_ADD_INC, and a bank address increment signal BA_ADD_INC so as to increase locations where active operation, write operation and precharge operation will be performed during the BISS test. The first refresh controller 320 receives the row address increment signal ROW_ADD_INC to count the test row addresses BIST_XA_ADD<0:12>, whereas the second refresh controller 330 receives the column address increment signal YI_ADD_INC to count the test column address signal BIST_YB_ADD<0:12>. The test command address generator 390 receives the bank address increment signal BA_ADD_IN to count the test bank addresses BIST_BA<0:2>. In this way, the row address, the column address and the bank address are changed so that the BISS test can be performed on all the unit cells in the semiconductor memory device.

Furthermore, the first and second refresh controllers 320 and 330 count the row address and the column address, and then outputs a test row reset signal BIST_XA_RSTN and a test column reset signal BIST_YB_RSTN so as to reset the row address and the column address, respectively. When the test pattern generator 380 receives the test row reset signal BIST_XA_RSTN and the test column reset signal BIST_YB_RSTN, the test pattern generator 380 resets the row address increment signal ROW_ADD_INC and the column address increment signal YI_ADD_INC.

The test command address generator 390 does not only receive the test column address BIST_YB_ADD<0:12> output from the second refresh controller 330 to generate the test address BIST_ADD<0:12> and the test bank address BIST_BA<0:2> that are input to the address buffer 360, but also outputs a plurality of test internal commands BIST_CKE, BIST_RAS, BIST_CAS, BIST_WE, BIST_CS and BIST_DIN, which are input to the command buffer 350, in response to the active enable signal ACT_EN, the write enable signal WT_EN and the precharge enable signal PRE_EN.

Figure 4A:
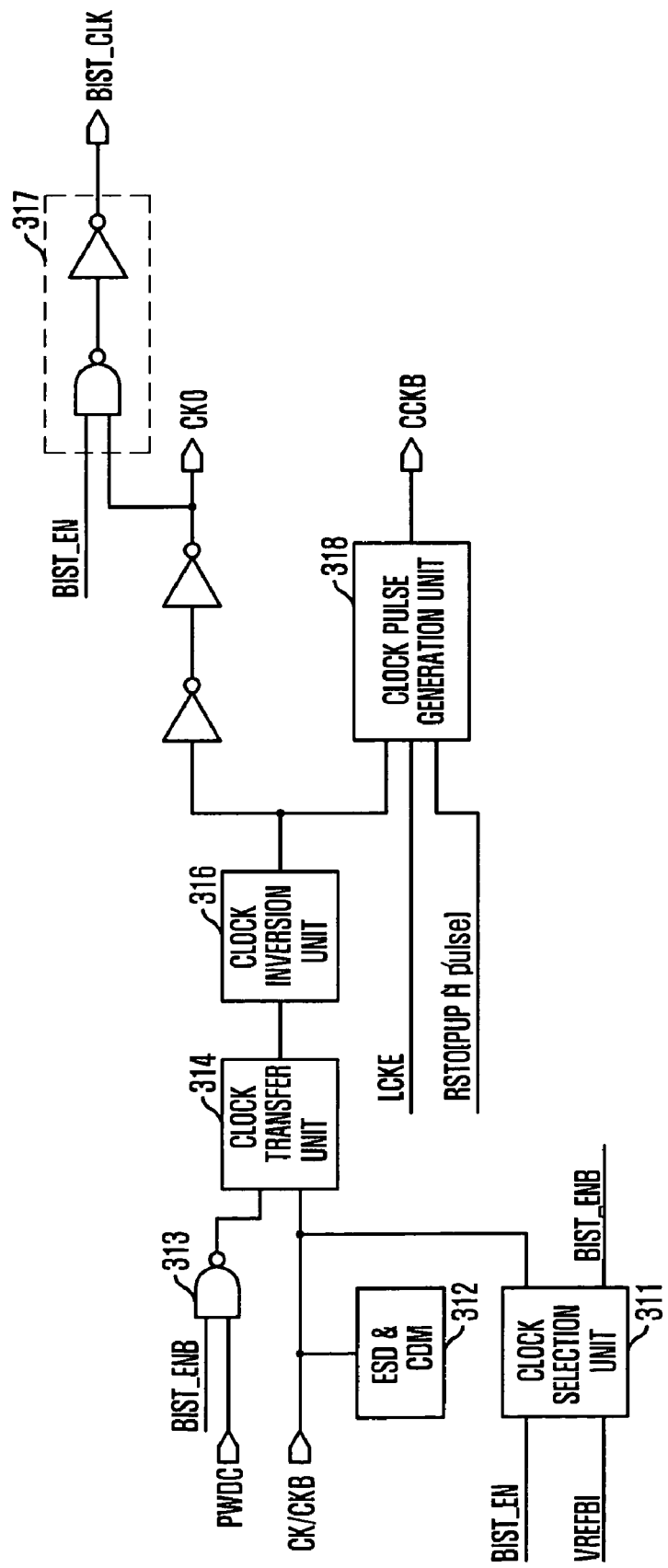
FIG. 4A is a block diagram of a clock buffer in FIG. 3.

FIG. 4A is a block diagram of the clock buffer 310 in FIG. 3.

Referring to FIG. 4A, the clock buffer 310 includes a clock selection unit 311, a signal distortion prevention unit 312, a transfer determination unit 313, a clock transfer unit 314, a clock inversion unit 316, a test clock output unit 317, and a clock pulse generation unit 318. Here, the signal distortion prevention unit 312, the clock transfer unit 314, the clock inversion unit 316, and the clock pulse generation unit 318 in the clock buffer 310 have the same configurations as the signal distortion prevention unit 112, the transfer determination unit 113, the clock transfer unit 114, the clock inversion unit 16, and the clock pulse generation unit 18 illustrated in FIG. 2A, and thus further description for them will be omitted herein.

The transfer determination unit 313 controls the clock transfer unit 314 to transfer the clock signal CL and the inverted clock signal CKB or the reference voltage VREFBI output from the clock selection unit 311 to the inside of the clock transfer unit 314. Specifically, the transfer determination unit 313 controls enabling/disabling of the clock transfer unit 314 according to the clock enable signal PWDC output from the first enabler 20 and an inverted pattern test enable signal BIST_ENB. Since the clock enable signal PWDC has a logic high level in a wafer-level test, the clock transfer unit 314 is disabled so that the clock signal is not transferred inside. To generate the internal test clock BIST_CLK for performing the BISS test in this state that the clock signal is not transferred inside, the clock buffer 310 of the semiconductor memory device in accordance with the present invention additionally includes the clock selection unit 311, and further the transfer determination unit 313 enables the clock transfer unit 314 by the pattern test enable signal BIST_EN.

The clock selection unit 311 transfers the reference voltage VREFBI has a level of half the level of the power supply voltage (VDD) to the clock transfer unit 314 instead of the inverted clock signal CKB in response to the pattern test enable signal BIST_EN. When the pattern test enable signal BIST_EN is activated, the clock selection unit 311 outputs the reference voltage VREFBI to the clock transfer unit 314, and the clock transfer unit 314 is enabled by the transfer determination unit 313 to receive the clock signal CK and the reference voltage VREFBI and transfer them inside through a differential amplifier. In addition, the clock selection unit 311 inverts the pattern test enable signal BIST_EN to output the inverted pattern test enable signal BIST_ENB to the transfer determination unit 313.

The test clock output unit 317 generates the test clock BIST_CLK in response to the pattern test enable signal BIST_EN. When the pattern test enable signal BIST_EN is activated, the test clock output unit 317 transfers an output signal of the clock inversion unit 316 as the internal test clock BIST_CLK.

Figure 4B:
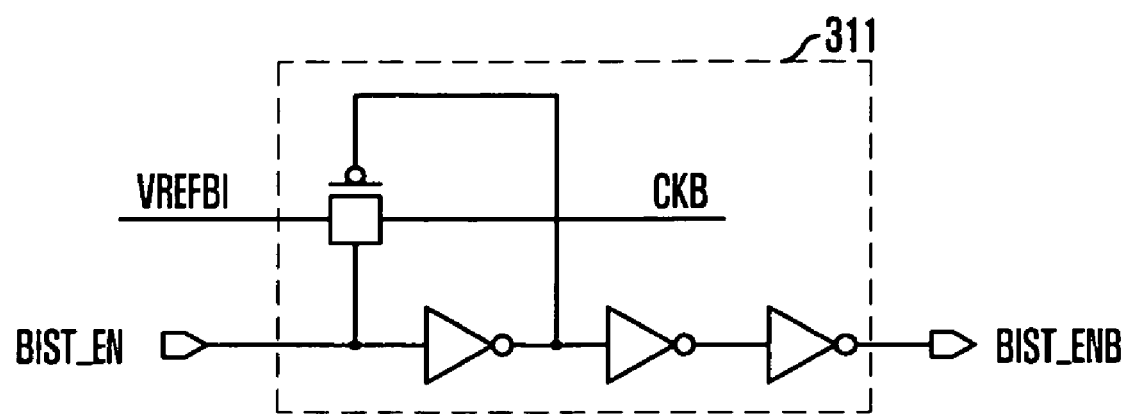
FIG. 4B is a circuit diagram of a clock selection unit in FIG. 4A.

FIG. 4B is a circuit diagram of the clock selection unit 311 in FIG. 4A.

Referring to FIG. 4B, the clock selection unit 311 includes a transfer gate configured to transfer the reference voltage VREFBI instead of the inverted clock signal CKB, and a plurality of inverters configured to invert the pattern test enable signal BIST_EN. The clock selection unit 311 buffers the inverted pattern test enable signal BIST_ENB to output it to the transfer determination unit 313.

Figure 5:
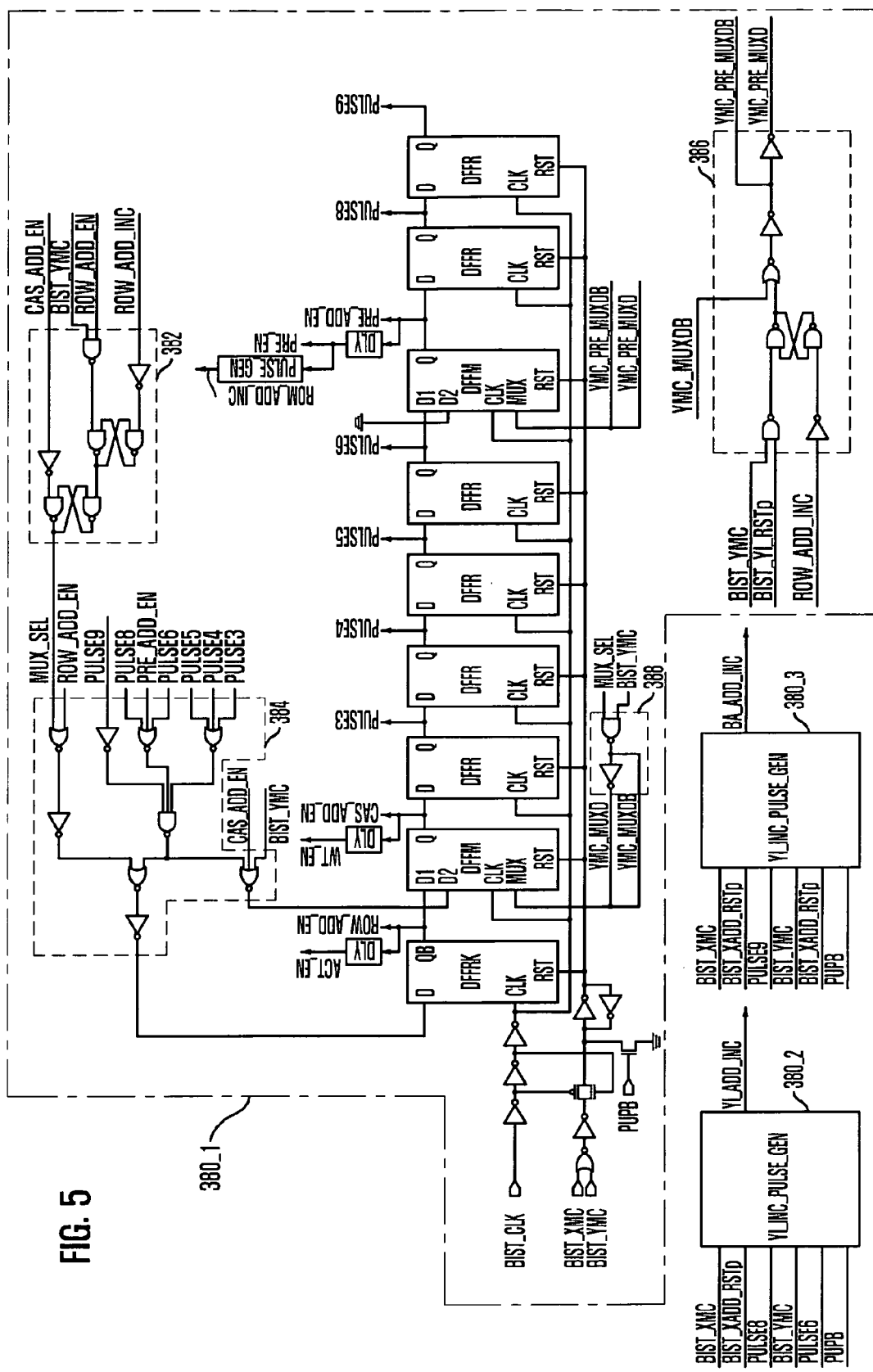
FIG. 5 is a block diagram of a test pattern generator in FIG. 3.

FIG. 5 is a block diagram of the test pattern generator 380 in FIG. 3. Particularly, FIG. 5 illustrates a pulse generation unit 380_1 of the test pattern generator 380.

Referring to FIG. 5, the test pattern generator 380 includes a pulse generation unit 380_1, a column address increment signal generation unit 380_2, and a bank address increment signal generation unit 380_3. Here, the pulse generation unit 380_1 generates a row address increment signal ROW_ADD_INC and a plurality of pulses PULSE3 to PULSE9 in response to outputs of the test decoder 340 and the first and second refresh controllers 320 and 330. The column address increment signal generation unit 380_2 is responsive to first or second pattern test signals BIST_XMC or BIST_YMC to generate a column address increment signal YI_ADD_INC for controlling a column address using predetermined pulse signals PULSE6 and PULSE8 selected from the plurality of pulses PULSE3 to PULSE9 which are output from the pulse generation unit 380_1. The bank address increment signal generation unit 380_3 is responsive to the first or second pattern test signals BIST_XMC or BIST_YMC to generate a bank address increment signal BA_ADD_INC for controlling a bank address using a predetermined pulse PULSE9 of the plurality of pulses PULSE3 to PULSE9.

Specifically, the pulse generation unit 380_1 sequentially activates the row address enable signal ROW_ADD_EN for enabling a row address, the active enable signal AT_EN for enabling an active operation, the column address enabling signal CAS_ADD_EN for enabling a column address, the write enable signal WT_EN for enabling write operation, a precharge address enable signal PRE_ADD_EN for enabling an address to carry out a precharge operation, a precharge enable signal PRE_EN for enabling precharge operation, and the row address increment signal ROW_ADD_INC for increasing the row address. When the second pattern test signal BIST_YMC is activated, the column address increment signal generation unit 380_2 repeatedly increases the column address increment signal YI_ADD_INC until the column address reset signal BIST_YB_RSTN output from the second refresh controller 330 is activated before the row address increment signal ROW_ADD_INC is activated. Further, when the first pattern test signal BIST_XMC is activated, the pulse generation unit 380_1 repeatedly activates the row address increment signal ROW_ADD_INC to activate a column address reset signal RIST_XA_RSTN output from the first refresh controller 320, and therefore the column address increment signal generation unit 380_2 increases the column address increment signal YI_ADD_INC. Finally, the bank address increment signal generation unit 380_3 increases the bank address signal BA_ADD_INC in response to the row address reset signal RIST_XA_RSTN and the column address reset signal RIST_YA_RSTN that are output from the first and second refresh controllers 320 and 330, when the first pattern test signal BIST_XMC or the second pattern test signal BIST_YMC is activated.

As described above, the column pulse generation unit 380_2 and the bank pulse generation unit 380_3 generate the column address increment signal YI_ADD_INC and the bank address increment signal BA_ADD_INC, respectively, but their configurations and operations are similar to those of the pulse generation unit 380_1. Hence, a person having ordinary skill in the art can fully comprehend the configurations and operations of the column pulse generation unit 380_2 and the bank pulse generation unit 380_3 from the following detailed description for the pulse generation unit 380_1, and thus detailed description for the column pulse generation unit 380_2 and the bank pulse generation unit 380_3 will be omitted herein.

Referring to FIG. 5, the pulse generation unit 380_1 includes a select signal generation unit 382, a timing setting unit 384, a first column signal control unit 386, a second column signal control unit 388, and a plurality of flip-flops. The plurality of flip-flops generate the plurality of pulses PULSE3 to PULSE9 sequentially activated in response to the internal test clock BIST_CLK, and receive the plurality of pulses PULSE3 to PULSE9 fedback through the timing setting unit 384 to activate the plurality of pulses PULSE3 to PULSE9 cyclically. The plurality of flip-flops may have first, second and third-type flip-flops DFFRK, DFFM and DFFR depending on function, for example, nine flip-flops in totality.

Operation of the pulse generation unit 380_1 according to the second test pattern signal BIST_YMC will be described first. The first-type flip-flop DFFRK receives an output of the timing setting unit 384 to activate the row address enable signal in response to the internal test clock BIST_CLK. The row address enable signal ROW_ADD_EN is delayed by a predetermined time through a delay unit, and then output as the active enable signal. The second-type flip-flops are positioned at a second location and a seventh location, and have an additional function of interrupting input signals transferred from the previous flip-flops in response to outputs of first and second column signal control units 386 and 388. More specifically, signals output from the second-type flip-flop DFFM at the second location are the column address enable signal CAS_ADD_EN and the write enable signal WT_EN, and signals output from the second-type flip-flop DFFM at the seventh location are the precharge address enable signal PRE_ADD_EN, the precharge enable signal PRE_EN, and the row address increment signal ROW_ADD_INC.

The second-type flip-flop at the seventh location is controlled by the first column signal control unit 386. The first column signal control unit 386 prevents the activation of the row address increment signal ROW_ADD_INC output from the second-type flip-flop DFFM at the seventh location until the column address reset signal BIST_YB_RSTN output from the second refresh controller 330 is activated, in response to the second test pattern signal BIST_YMC for performing a test pattern of increasing a column address for one row address. At this time, the column address increment signal generation unit 380_2 can repeatedly activate the column address increment signal YI_ADD_INC in response to the pulse PULSE6 output from the third-type flip-flop DFFR at a sixth location. After the column addresses are activated in sequence, the second refresh controller 330 activates the column address reset signal BIST_YN_RSTN.

Operation of the pulse generation unit 380_1 according to the first test pattern signal BIST_XMC will be described below. The pulse generation unit 380_1 activates the row address increment signal ROW_ADD_INC, of which a timing is delayed through the plurality of flip-flops, through the second-type flip-flop DFFM at the seventh location. The first refresh controller 320 outputs the row address reset signal BIST_XB_RSTN after the row addresses are activated in sequence. When the row address reset signal BIST_X-B_RSTN is activated, the column address increment signal generation unit 380_2 activates the column address increment signal YI_ADD_INC.

When both the row and column addresses are increased in response to the first and second test pattern signals BIST_XMC and BIST_YMC, the first and second refresh controllers 320 and 330 activate the row address reset signal BIST_XB_RSTN and the column address reset signal BIST_YB_RSTN. The bank address increment signal generation unit 380_3 receives the row address reset signal BIST_XB_RSTN and the column address reset signal BIST_YB_RSTN activated by the first and second test pattern signals BIST_XMC and BIST_YMC, thereby activating the bank address increment signal BA_AD_INC.

As mentioned above, the test pattern generator 380 can generate the test address pattern according to the first and second test pattern signals BIST_XMC and BIST_YMC using the first and second refresh controllers 320 and 330. Hitherto, a key operation of the test pattern generator 380 has been described. In addition to the aforesaid operation, a person having ordinary skill in the art can fully comprehend other operations, e.g., precharge operation, from the accompanying circuit and block diagrams, and thus further description will be omitted herein.

Figure 6A:
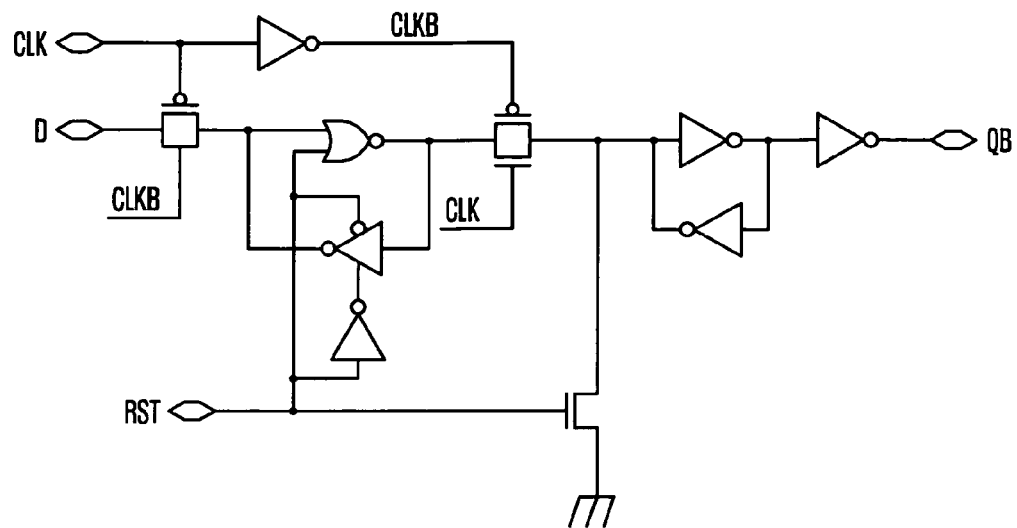
FIG. 6A is a circuit diagram of a first-type flip-flop in FIG. 5.

FIG. 6A is a circuit diagram of the first-type flip-flop DFFRK in FIG. 5.

Referring to FIG. 6A, the first-type flip-flop DFFRK transfers an input signal D to the inside thereof in response to the internal test clock BIST_CLK input through a clock terminal CLK, and then outputs an inversion value QB. Therefore, when a low-level signal is input from the timing setting unit 384, the first-type flip-flop DFFRK can output the row address enable signal ROW_ADD_EN of a pulse-type signal that is activated to a logic high level. Herein, a person having ordinary skill in the art can fully comprehend the configuration and operation of the circuit, from the accompanying circuit and block diagrams, and thus further description will be omitted.

Figure 6B:
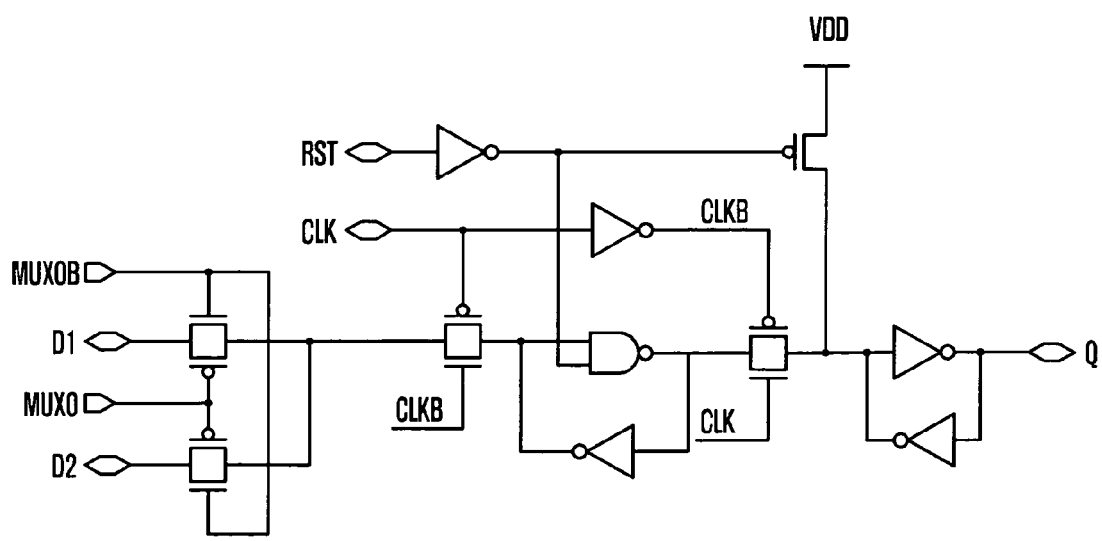
FIG. 6B is a circuit diagram of a second-type flip-flop in FIG. 5.

FIG. 6B is a circuit diagram of the second-type flip-flop DFFM in FIG. 5.

Referring to FIG. 6B, the second-type flip-flop DFFM further includes a plurality of transfer gates configured to transfer two input signals D1 and D2 in response to select signals MUX and MUXB, and transfers the transferred signal in response to the internal test clock BIST_CLK input through the clock terminal CLK, and then outputs the transferred signal.

Referring back to FIG. 5, the second-type flip flop DFFM at the second location receives an output signal of the first-type flip-flop DFFRK at the first location and an output signal of the timing setting unit 384, so that it can output the column address enable signal CAS_ADD_EN in response to the second test pattern signal BIST_YMC. The second-type flip flop DFFM at the seventh location receives an output signal of the third-type flip-flop DFFR at the sixth location and a ground voltage, so that it can selectively activate the precharge address enable signal PRE_ADD_EN in response to output signals YMC_PRE_MUXD and YMC_PRE_MUXDB of the first column signal control unit 386.

Figure 6C:
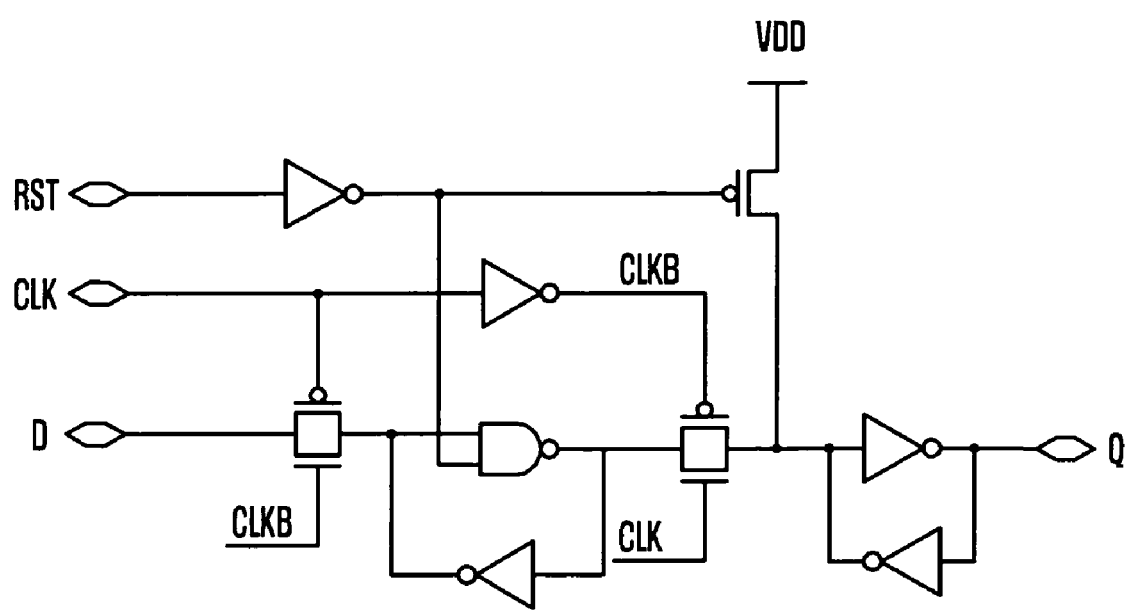
FIG. 6C is a circuit diagram of a third-type flip-flop in FIG. 5.

FIG. 6C is a circuit diagram of the third-type flip-flop DFFR in FIG. 5.

Referring to FIG. 6C, the third-type flip-flop DFFR transfers an input signal D in response to the internal test clock BIST_CLK input through a clock terminal CLK, and thereafter outputs a signal Q. Since there is no great difference between a typical flip-flop and the third-type flip-flop DFFR, and a person having ordinary skill in the art can fully comprehend the configuration and operation of the circuit, from the accompanying circuit and block diagrams, further description will be omitted herein.

Figure 7:
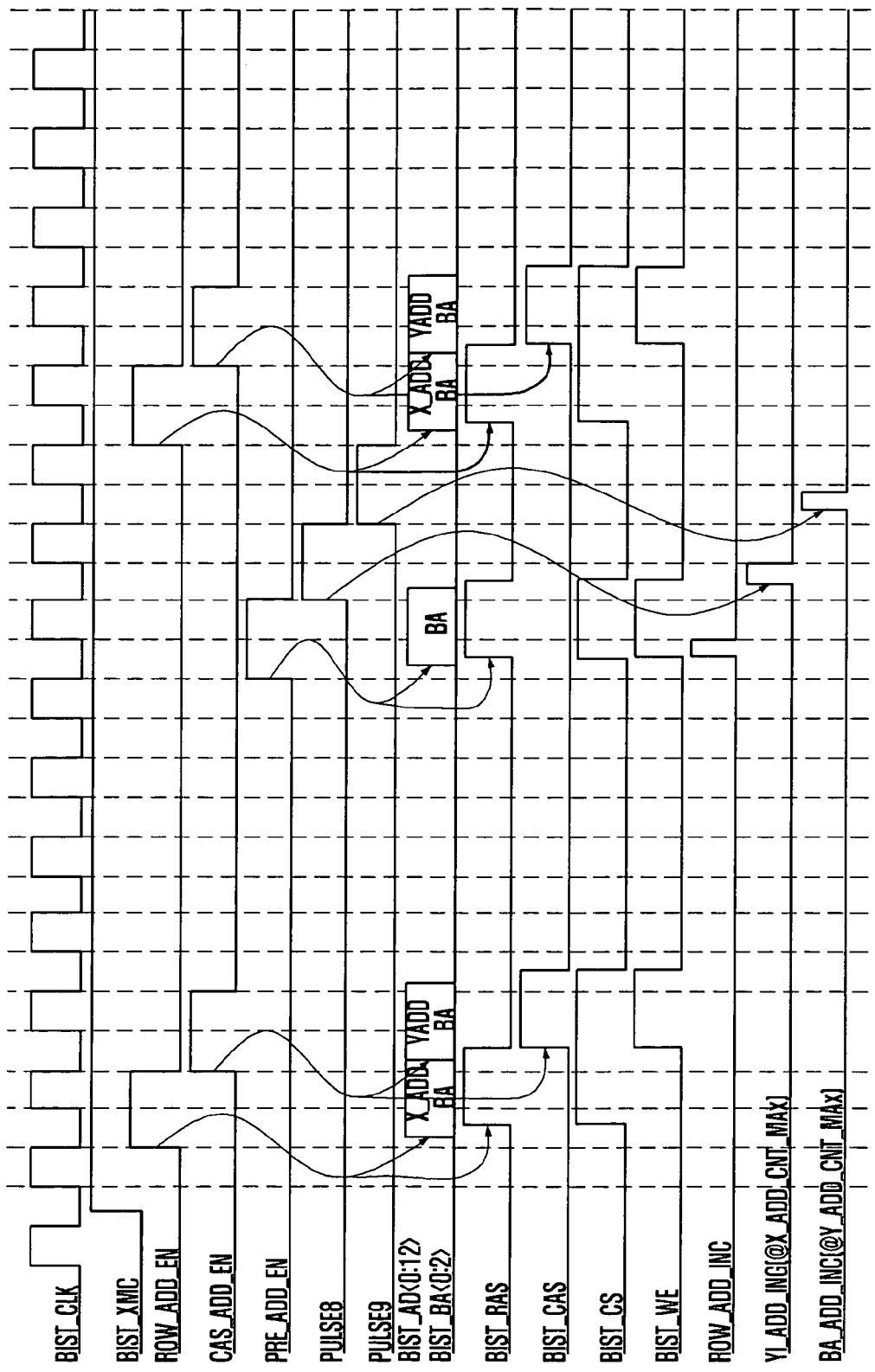
FIG. 7 is a timing diagram illustrating operation of the test pattern generator in FIG. 5.

FIG. 7 is a timing diagram illustrating operation of the test pattern generator 380 in FIG. 5.

Referring to FIG. 7, when the first test pattern signal BIST_XMC is activated, the row address increment signal ROW_ADD_INC, the column address increment signal YI_ADD_INC and the bank address increment signal BA_ADD_INC generated from the test pattern generator 380 are activated.

Specifically, when the precharge address enable signal PRE_ADD_EN output from the second-type flip-flop at the seventh location is activated, the precharge enable signal PRE_EN is delayed through a delay unit DLY and then activated. Thereafter, the row address increment signal ROW_ADD_INC with a pulse width modulated is generated through a pulse generator (PULSE_GEN). After the row address is increased to the maximum (@X_ADD_CNT_MAX), the test pattern generator 380 activates the column address increment signal YI_ADD_INC in response to the pulse PULSE8 output from the pulse generation unit 380_1. After the column address is increased to the maximum (@Y_ADD_CNT_MAX), the bank address increment signal BA_ADD_INC is activated in response to the pulse PULSE9 output from the pulse generation unit 380_1.

When the row address enable signal ROW_ADD_EN output from the first-type flip-flop DFFRK is activated, the test command address generator 390 activates a test row access strobe signal BIST_RAS for accessing a row. Similarly, when the column address enable signal CAS_ADD_EN output from the second-type flip-flop DFFM at the second location is activated, the test command address generator 390 activates a test column access strobe signal BIST_CAS for accessing a column.

Figure 8A:
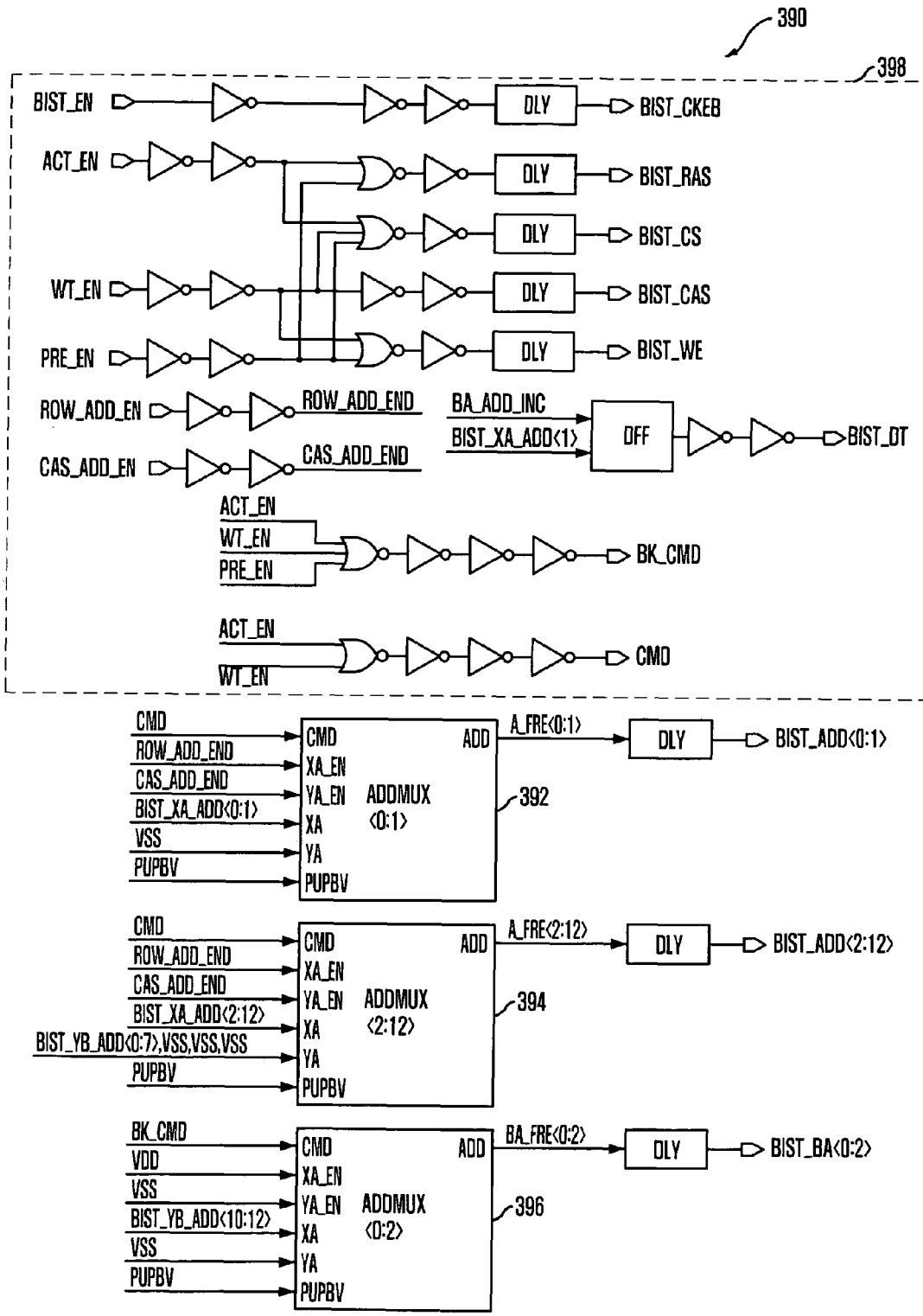
FIG. 8A is a block diagram of a test command address generator in FIG. 3.

FIG. 8A is a block diagram of the test command address generator 390 in FIG. 3.

Referring to FIG. 8A, the test command address generator 390 includes a command/data generation unit 398, and first to third address generation units 392, 394 and 396. The command/data generation unit 398 decodes the command control signals ACT_EN, WT_EN, PRE_EN, ROW_ADD_EN, CAS_ADD_EN and BA_ADD_INC output from the test pattern generator 380 to generate the test internal commands BIST_CKEB, BIST_RAS, BIST_CS, BIST_CAS and BIST_WE, and also generates test data BIST_OT using some of the address control signals. The first to third address generation units 392, 394 and 396 selectively transfer the row, column and bank addresses BIST_XA_ADD<0:1>, BIST_XA_ADD<2:12>, BIST_YB_ADD<0:7> and BIST_YB_ADD<10:12>, which are output from the first and second refresh controllers 320 and 330.

The command/data generation unit 398 generates the test row access strobe signal BIST_RAS in response to the active enable signal ACT_EN output from the test pattern generator 380, and generates the test column access strobe signal BIST_CAS in response to the write enable signal WT_EN. In addition, the command/data generation unit 398 generates a test module select signal BIST_CS in response to the test row access strobe signal BIST_RAS and test column access strobe signal BIST_CAS. Further, the command/data generation unit 398 receives the bank address increment signal BA_ADD_INC and the test row address BIST_XA_ADD<1> output from the first refresh controller 320 to thereby generate the test data BIST_DT to be used for every bank.

The first to third address generation units 392, 394 and 396 receive the test row addresses BIST_XA_ADD<0:12> and the test column addresses BIST_YB_ADD<0:12> generated from the first and second refresh controllers 320 and 330 to output a row address, a column address and a bank address for accessing unit cells of the cell array 60. Each of the first to third generation units 392, 394 and 396 multiplexes input addresses in response to the output of the command/data generation unit 398, and then generates the test addresses BIST_ADD<0:12> and BIST_BA<0:2> output from the first to third address generation units 392, 394 and 396, which are the same as actual addresses input from the outside.

Figure 8B:
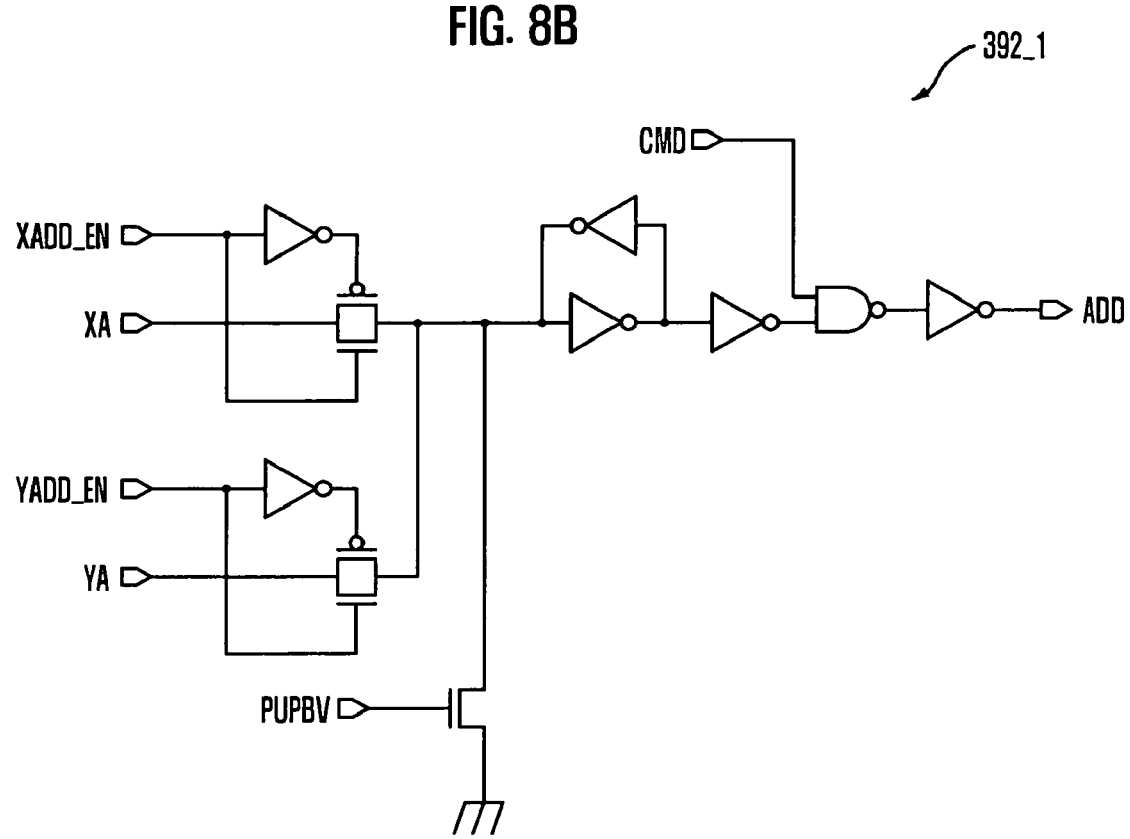
FIG. 8B is a circuit diagram of a first address multiplexing unit in FIG. 8A.

FIG. 8B is a circuit diagram of a first address multiplexing unit 392_1 in FIG. 8A. Here, the first address multiplexing unit 392_1 is exemplarily illustrated as one of a plurality of address multiplexing units in the first address generation unit 392. Therefore, although not shown, each of the first to third address generation units 392, 394 and 396 includes a plurality of address multiplexing units corresponding to respective bits of the output test addresses BIST_ADD<0:12> and BIST_BA<0:2>.

Referring to FIG. 8B, the first address multiplexing unit 392_1 selectively transfers signals transferred through two address input terminals XA and YA in response to row and column address discriminate signals ROW_ADD_END and CAS_ADD_END, which are control signals output from the command/data generation unit 398, and thereafter latches the transferred signals inside. Afterwards, the first address multiplexing unit 392_1 outputs the latched signal as an address in response to a command signal CMD. Further, the first address multiplexing unit 392 can reset an address output in response to an address reset signal PUPBV.

Figure 9A:
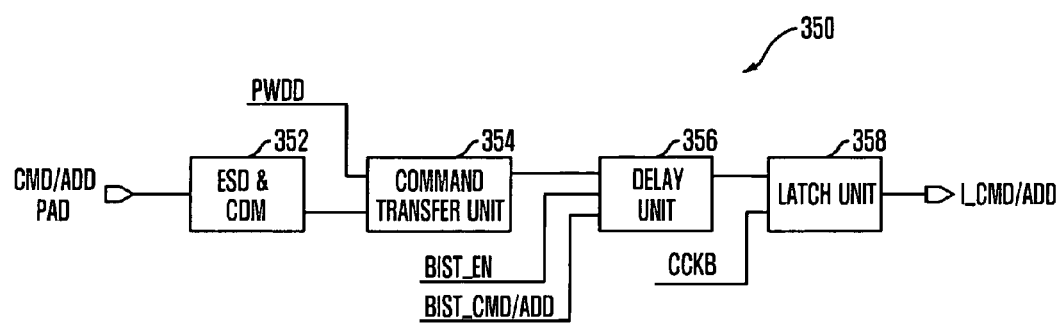
FIG. 9A is a block diagram of a command buffer in FIG. 3.

FIG. 9A is a block diagram of the command buffer 350 in FIG. 3.

Referring to FIG. 9A, the command buffer 350 includes a distortion prevention unit 352, a command transfer unit 354, a delay transfer unit 356, and a latch unit 358. Herein, the distortion prevention unit 352, the command transfer unit 354 and the latch unit 358 in the command buffer 350 have the same functions as the distortion prevention unit 152, the command transfer unit 154 and the latch unit 158 in FIG. 2, and thus further description for them will be omitted herein.

While the delay unit 156 of FIG. 2 only buffers and delays an input signal, the delay transfer unit 356 can output a command BIST_CMD/ADD used in the BISS test in response to the test command signal BIST_EN instead of transferring the command signal received from the command transfer unit 354.

The semiconductor memory device illustrated in FIG. 3 further includes the address buffer 360 and the data buffer 370 besides the command buffer 350. The address buffer 360 and the data buffer 370 may be designed similarly to the command buffer 350 so as to selectively transfer a command signal, an address, and data, or output a command, an address and data used in BISS test.

Figure 9B:
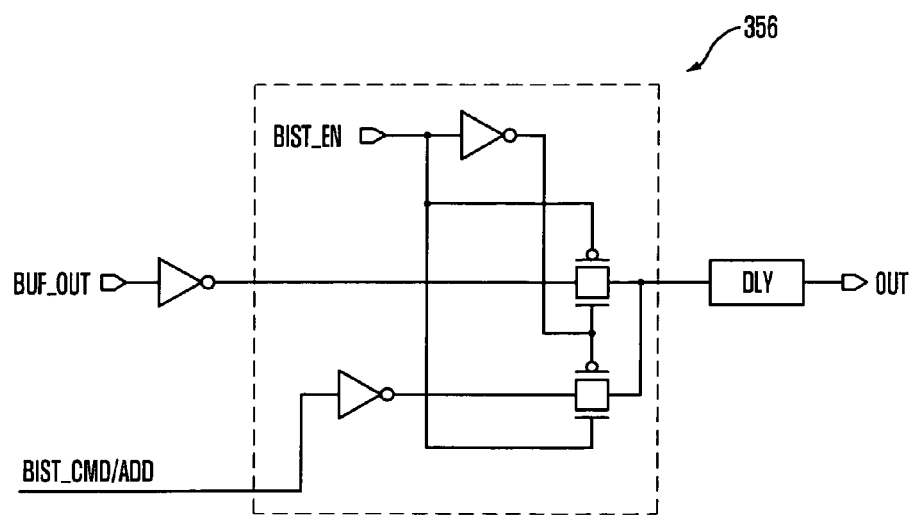
FIG. 9B is a block diagram of a delay transfer unit in FIG. 9A.

FIG. 9B is a block diagram of the delay transfer unit 356 in FIG. 9A.

Referring to FIG. 9B, the delay transfer unit 356 transfers an output of the command transfer unit 354 or the test command BIST_CMD/ADD in response to the test command signal BIST_EN using a plurality of transfer gates. In addition, the delay transfer unit 356 includes a delay unit DLY configured to buffer signals transferred from the plurality of transfer gates.

Figure 10A:
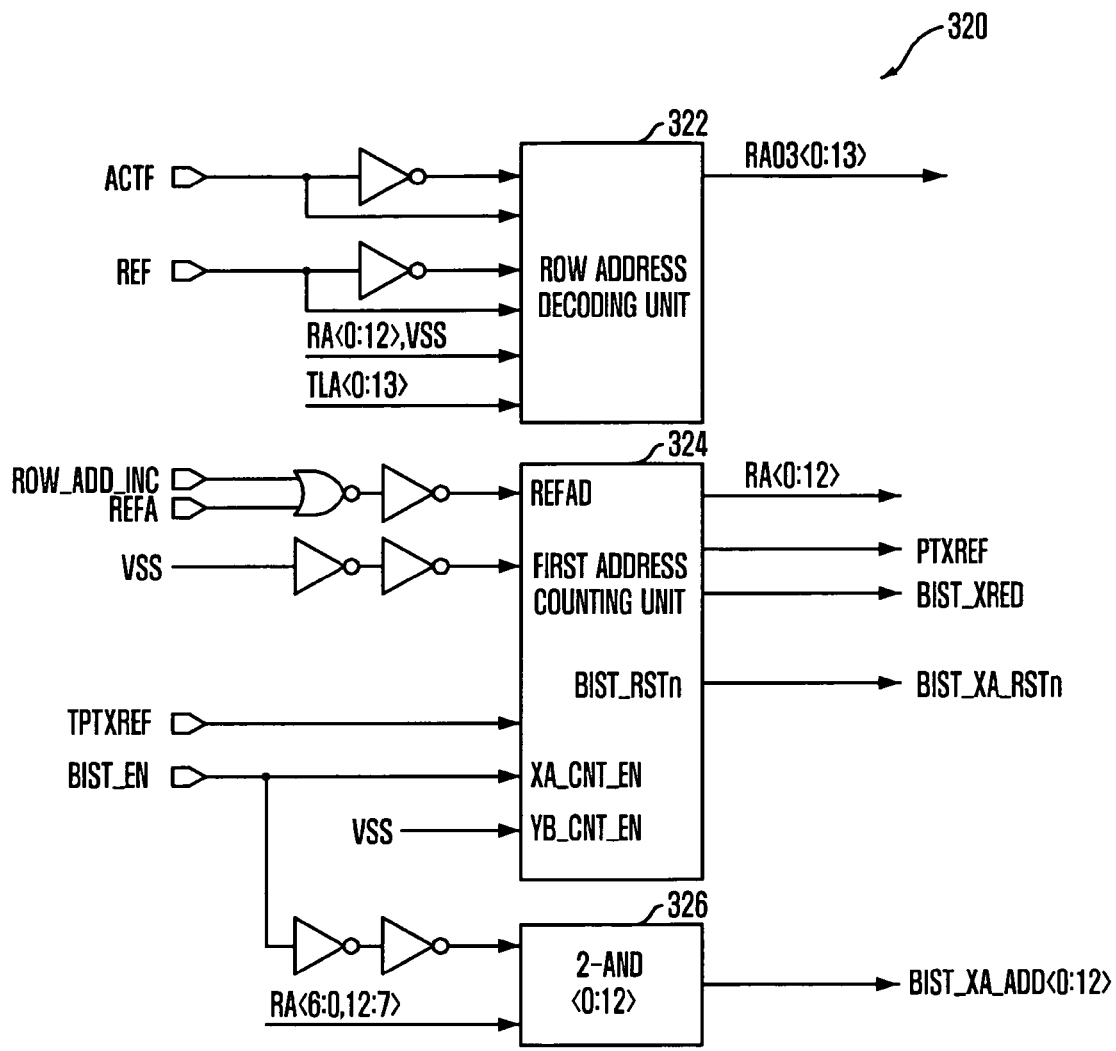
FIG. 10A is a block diagram of a first refresh controller in FIG. 3.

FIG. 10A is a block diagram of the first refresh controller 320 in FIG. 3.

Referring to FIG. 10A, the first refresh controller 320 includes a row address decoding unit 322, a first address counting unit 324, and a test row address generation unit 326. The row address decoding unit 322 decodes internal address signals RA<0:12> and TLA<0:13> that are input at a timing when the active command ACTF or the refresh command REF is activated, thereby outputting resultant signals RA03<0:13> for a enabling corresponding word line. The first counting unit 324 sequentially activates word lines in the first to fourth banks when the auto-refresh command REFA or the test refresh signal TPTXREF is activated, or outputs the row address reset signal BIST_XA_RSTN n response to the test command signal BIST_EN and the row address increment signal ROW_ADD_INC. The test row address generation unit 326 combines the addresses RA<0:12> output from the first address counting unit 324 in response to the test command signal BIST_EN to output the test row addresses BIST_XA_ADD<0:12>.

The test row address generation unit 326 includes a plurality of AND gates performing AND operation on the test command signal BIST_EN and the addresses RA<0:12> output from the first address counting unit 324. That is, the test row address generation unit 326 outputs the addresses RA<0:12> output from the first address counting unit 324 as the test row addresses BIST_XA_ADD<0:12> when the test command signal BIST_EN is activated. However, when the test command signal BIST_EN is not activated, the test row address generation unit 326 outputs all the row addresses having a logic low level. The row address decoding unit 322 is identical in function and configuration to the row address decoding unit 122 of FIG. 2C, and thus further description for it will be omitted herein.

Figure 10B:
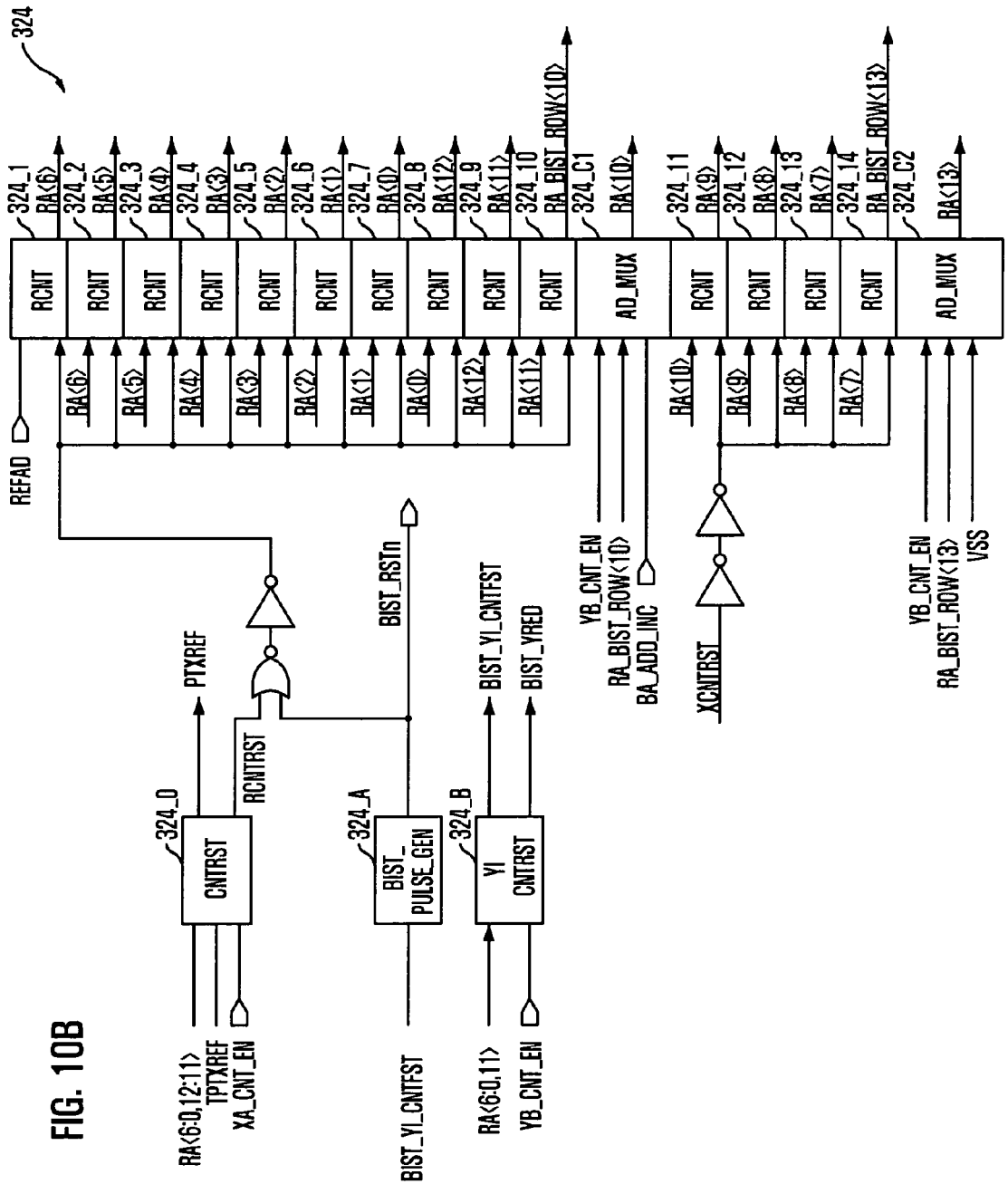
FIG. 10B is a block diagram of a first address counting unit in FIG. 10A.

FIG. 10B is a block diagram of the first address counting unit 324 in FIG. 10A.

Referring to FIG. 10B, the first address counting unit 324 includes a plurality of unit counters 324_1 to 324_14, a counter reset unit 324_0, first and second supplementary multiplexing units 324_C1 and 324_C2, a reset control unit 324_B, and a test pulse generation unit 324_A. The plurality of unit counters 324_1 to 324_14 activate word lines in the first to fourth banks sequentially. The counter reset unit 324_0 resets the plurality of unit counters 324_1 to 324_14 and refreshes a redundancy circuit in response to the test refresh signal TPTXREF. The first and second supplementary multiplexing units 324_C1 and 324_C2 control the test bank addresses to be counted through predetermined unit counters 324_11 to 324_14 of the plurality of unit counters 324_1 to 324_14. The reset control unit 324_B controls the counting of the test bank addresses. The test pulse generation unit 324_A outputs the row address reset signal BIST_XA_RSTN in response to an output of the reset controlling unit 324_B.

In FIG. 2D, the plurality of unit counters 124_1 to 124_14 receiving the buffered signal REFAD of the auto-refresh command REFA outputs the row addresses RA03<0:13> for sequentially enabling the word lines in the first to fourth banks. The first address counting unit 324, however, should count the row address and bank address for BISS test, not row addresses of a specific bank. Therefore, some unit counters 324_1 to 324_10 of the plurality of unit counters 324_1 to 324_14 are used to count the row address during the BISS test, and the other unit counters 324_11 to 324_14 are used to count the bank address. To this end, the address counting unit is disposed such that the plurality of counters can count different addresses through the first and second supplementary multiplexing units 324_C1 and 324_C2.

Referring to FIG. 10A, the test command signal BIST_EN is input through a first enable terminal XA_CNT_EN of the first address counting unit 324, and a ground voltage VSS is input through a second enable terminal YI_CNT_EN. When the ground voltage VSS is applied through the second enable terminal YI_CNT_EN, the first and second supplementary multiplexing units 324_C1 and 324_C2 are disabled. Therefore, some unit counters 324_1 to 324_10 and the other unit counters 324_11 to 324_14 are completely discriminated thereamong so that the first unit counter 324_1 starts counting addresses in response to the row address increment signal ROW_ADD_INC input through a refresh pulse terminal REFAD. The countered addresses RA<6:0, 12:7> are input to the test row address generation unit 326, and finally output in response to the test command signal BIST_EN.

Figure 11:
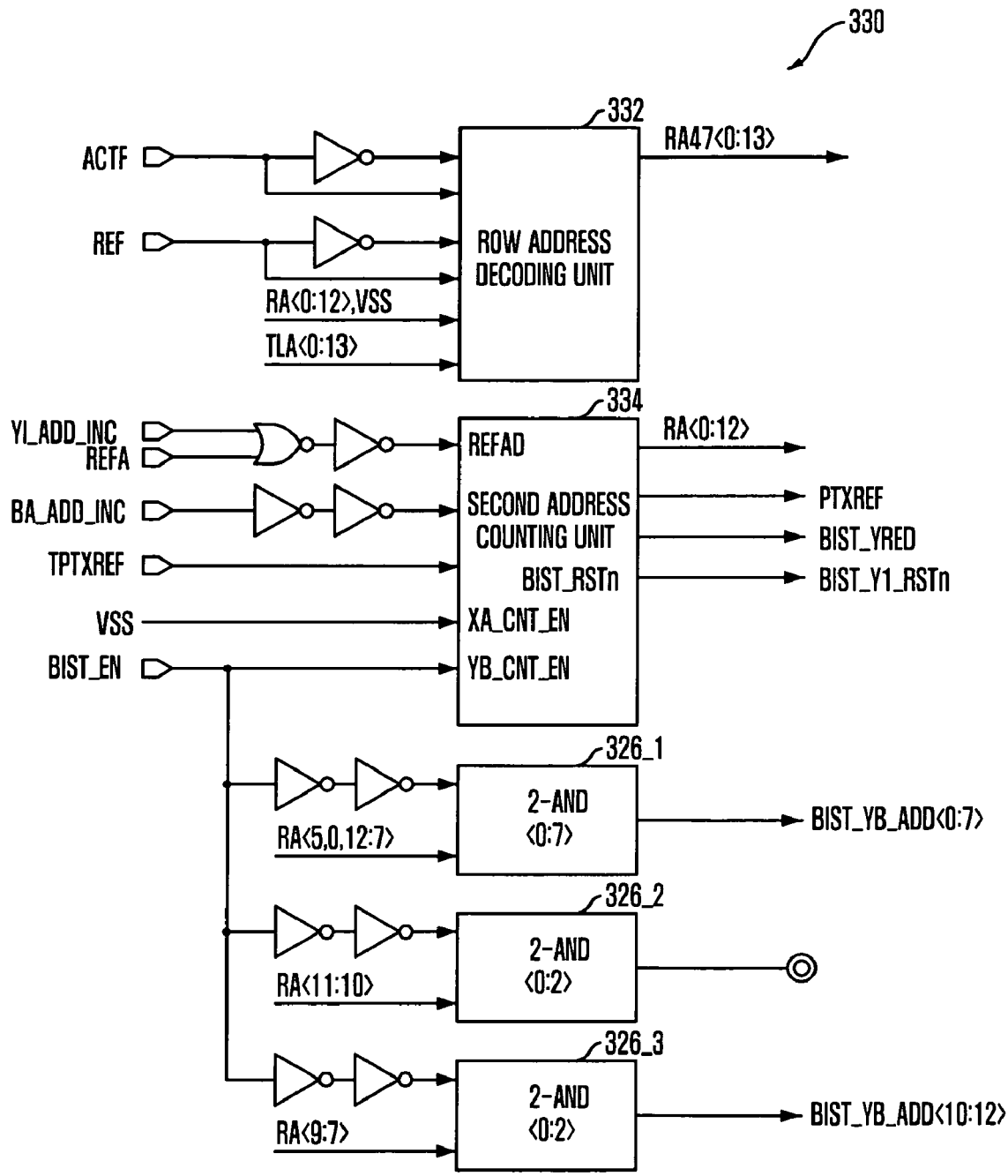
FIG. 11 is a block diagram of a second refresh controller in FIG. 3.

FIG. 11 is a block diagram of the second refresh controller 330 in FIG. 3.

Referring to FIG. 11, the second refresh controller 330 includes a row address decoding unit 332, a second address counting unit 334, a test column address generation unit 336_1, and a test bank address generation unit 326_3. The row address decoding unit 332 decodes the internal address signals RA<0:12> and TLA<0:13> that are input at a timing when the active command ACTF or the refresh command REF is activated, thereby outputting resultant signals RA47<0:13> for a enabling word lines in fifth to eighth banks. The second counting unit 334 sequentially activates the word lines in the first to fourth banks when the auto-refresh command REFA or the test refresh signal TPTXREF is activated, or outputs the row address reset signal BIST_X-A_RSTN in response to the test command signal BIST_EN and the row address increment signal ROW_ADD_INC. The test column address generation unit 336_1 combines the addresses RA<0:12> output from the second address counting unit 334 in response to the test command signal BIST_EN to output the test column addresses BIST_YB_ADD<0:12>. The second refresh controller 330 further includes a floating unit 336_2 for floating unnecessary addresses of the addresses RA<0:12> output from the second address counting unit 334.

The test column address generation unit 326_1 includes a plurality of AND gates performing AND operation on the test command signal BIST_EN and the addresses RA<5, 0, 12:7> of the addresses RA<0:12> output from the second address counting unit 334. The test bank address generation unit 326_3 includes a plurality of AND gates performing AND operations on the test command signal BIST_EN and the addresses RA<9:7> of the addresses RA<0:12> output from the second address counting unit 334. That is, the test column address generation unit 336_1 and the test bank address generation unit 326_3 output the addresses RA<0:12> of the second address counting unit 334 as the test column addresses BIST_YB_ADD<0:7> and the test bank addresses BIST_Y-B_ADD<10:12> when the test command signal BIST_EN is activated. However, when the test command signal BIST_EN is not activated, the test row address generation unit 336 outputs all the column and bank addresses having a logic low level. Since the row address decoding unit 332 is identical in function and configuration to the row address decoding unit 322 of FIG. 10A except that the row address output for normal refresh operation in the former is used for a bank different from that of the latter, and also identical in function and configuration to the row address decoding unit 122 of FIG. 2C, further description for the row address decoding unit 332 will be omitted herein.

The second address generating unit 336 also has the same configuration as the first address generation unit 326 of FIG. 10B. Only different is that the ground voltage VSS is input through the first enable terminal XA_CNT_EN of the second address generation unit 336, and the test command signal BIST_EN is input through the second enable terminal YI_CNT_EN, which makes internal unit counters operate differently from those of the first address generating unit 326. When the test command signal BIST_EN is applied through the second enable terminal YI_CNT_EN, the first and second supplementary multiplexing units 324_C1 and 324_C2 are enabled. Therefore, some unit counters 324_1 to 324_10 count the column addresses in response to the column address increment signal YI_ADD_INC input through the refresh pulse terminal REFAD, and the other unit counters 324_11 to 324_14 count the bank addresses in response to the bank address increment signal BA_ADD_INC.

As for specific operation, the plurality of unit counters 324_1 to 324_10 of the second address counting unit 334 count the column address in response to the column address increment signal YI_ADD_INC. After the column address is counted for the last row address, the reset control unit 324_B outputs a counter reset signal BIST_YI_CNTRST in response to some counted column addresses RA<6:0, 11> and the test command signal BIST_EN input through the second enable terminal YI_CNT_EN of the second address counting unit 334. The column address reset signal BIST_YI_RSTN is generated through the test pulse generation unit 324_A in response to the counter reset signal BIST_YI_CNTRST. Thereafter, the plurality of unit counters 324_11 to 324_14 receives the specific address RA<10> through the first supplementary multiplexing unit 324_C1 to count the bank address in response to the bank address increment signal BA_ADD_INC.

As described above, the semiconductor memory device of the present invention generates the row addresses RA03<0:13> and RA47<0:13> for refreshing unit cells in two bank groups having a plurality of banks through the first and second refresh controllers 320 and 330 during normal operation. During the BISS test, however, the plurality of unit counters, which are used to count the row addresses RA03<0:13> and RA47<0:13>, are divided to generate row addresses, column addresses and bank addresses for applying a stress on each of the unit cells. In addition, to perform a test according to the first and second test pattern signals BIST_XMC and BIST_YMC output from the test decoder 340, the first and second refresh controller 320 and 330 may generate row addresses, column addresses and bank addresses through different methods according to the plurality of test address control signals, e.g., the row address increment signal ROW_ADD_INC, the column address increment signal YI_ADD_INC, which are output from the test pattern generator 380.

Figure 12:
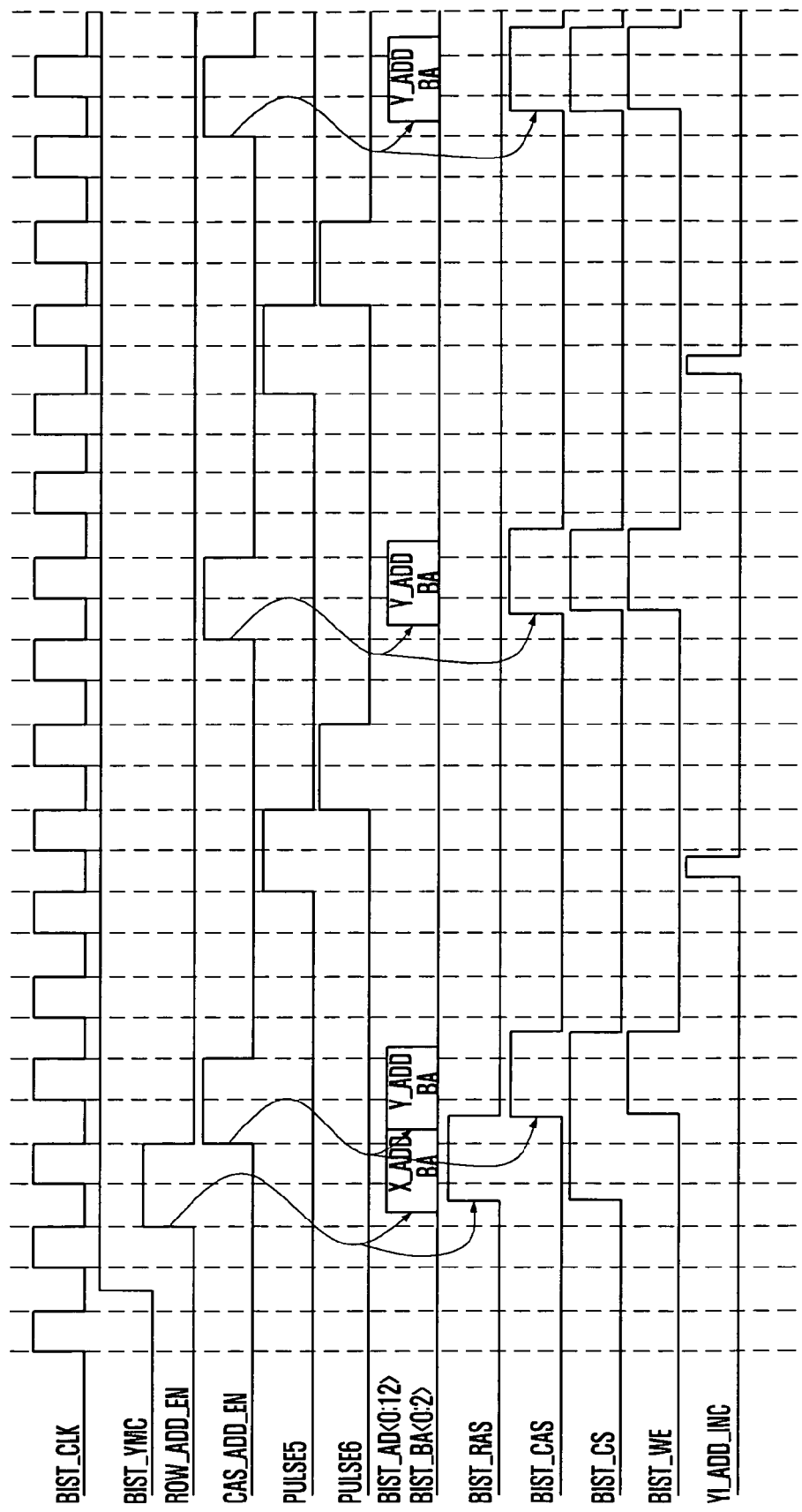
FIG. 12 is a timing diagram illustrating operation of the semiconductor memory device in FIG. 3.

FIG. 12 is a timing diagram illustrating operation of the semiconductor memory device in FIG. 3.

Referring to FIG. 12, the row address and the column address are generated in response to the second test pattern signal BIST_YMC, and then a stress is applied to a corresponding unit cell. The application of the stress to the unit cell means that the test data are written to the unit cell in response to the write enable signal BIST_EN. Afterwards, the column address is increased in response to the column address increment signal YI_ADD_INC, and then a stress is again applied to the unit cell. The activation of the test addresses BIST_ADD<0:12>, the row address enable signals ROW_ADD_EN, the column address enable signal CAS_ADD_EN, and the plurality of test commands BIST_RAS, BIST_CAS, BIST_CS and BIST_WE are achieved by operations of the test pattern generator 380 and the test command address generator 390, which has been already described, and thus further description will be omitted herein.

For reference, the plurality of test commands have a pulse width corresponding to one cycle of the internal test clock BIST_CLK. Although the internal test clock BIST_CLK has the same frequency as a system clock under a real environment where a semiconductor memory device operates, an operating margin of the test command is sufficient, thus making it possible to perform a high-speed test.

As described above, in a testing method of a semiconductor memory device in accordance with an embodiment of the present invention, the test operation codes WA<8,9,11,12> input from the outside through the address pad at a wafer-level are decoded, and a plurality of addresses and data patterns are then internally generated according to the result. Then, each of the unit cells is accessed using the generated addresses and data patterns, thereby detecting a defect.

A method of testing a semiconductor memory device, includes entering a test mode in response to an external signal at a wafer-level, determining whether to perform a BISS test using a test code applied through a specific address pad, outputting an address control signal and a command control signal for a multi-pattern test including a row pattern test and a column pattern test, when the BISS is performed, generating a row address, a column address and a bank address for accessing a unit cell in a cell array in response to the address control signal, generating an internal test command and a test data in response to the command control signal, and performing the BISS in response to the row address, the column address, the bank address, the internal test command and the test data.

The outputting of the address control signal and the command control signal includes outputting an activated row address increment signal for increasing the command control signal and the row address according to one of the row pattern test and the column pattern test, repeatedly activating a column address increment signal for controlling the column address before activation of the row address increment signal according to the row pattern test, and generating the column address increment signal after the row address increment signal is repeatedly activated, according to the column pattern test, and controlling the bank address according to one of the row pattern test and the column pattern test when signals for resetting the row address and the column address are output.

Here, the row pattern test is performed by repeating inputting/outputting of data by changing a column address based on a row address of the cell array, and the column pattern test is performed by repeating inputting/outputting of data by changing the row address based on the column address of the cell array.

In accordance with the present invention, since a stress test can be performed during a test during burn-in (TDBI) process at a wafer-level using a multi-pattern even under a restrictive environment after a semiconductor memory device is packaged, it is possible to prevent damages of a test equipment and a semiconductor memory device that may occur in the TDBI process, thus increasing productivity.

Specifically, while the conventional test was performed under restrictive environment after the semiconductor memory device has been packaged in order to prevent the damages of a test equipment and a semiconductor memory device, the inventive test is performed unlimitedly at a wafer-level, which provides several advantages such as a short test time, low fabrication cost, and high productivity.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a cell array including a plurality of unit cells; and
a test circuit configured to perform a built-in self-stress (BISS) test for detecting a defect by performing a plurality of internal operations including a write operation through an access to the unit cells using a plurality of patterns during a test procedure carried out at a wafer-level,
wherein the test circuit comprises:
a test decoder configured to decode signals input via a plurality of address pads to output a test control signal controlling the BISS test and a test carried out at a wafer-level;
a test pattern generator configured to generate a test pattern for the plurality of internal operations in response to an output of the test decoder; and
a test command address generator configured to generate an internal test command an internal address signal in response to an output of the test pattern generator.

2. The semiconductor memory device as recited in claim further comprising:
- a first refresh controller configured to count an address for refreshing unit cells in one group among a plurality of banks during a normal operation, and configured to generate a row address in response to the output of the test pattern generator during the BISS test; and
- a second refresh controller configured to count an address for refreshing unit cells in another group among the plurality of banks during a normal operation, and configured to generate a column address and a bank address in response to the output of the test pattern generator during the BISS test.

3. The semiconductor memory device as recited in claim 2, wherein the first refresh controller comprises:
- a refresh counter configured to count a row address for performing a refresh operation on unit cells in a group including a plurality of banks in response to a refresh command during the normal operation; and
- an auto-refresh counter configured to count a row address for performing an auto-refresh operation on unit cells in the group in response to an auto-refresh command during the normal operation, and configured to count the row address in response to the output of the test pattern generator during the BISS test.

4. The semiconductor memory device as recited in claim 3, wherein the second refresh controller comprises:
- a refresh counter configured to count a row address for performing a refresh operation on unit cells in another group including a plurality of banks in response to a refresh command during the normal operation; and
- an auto-refresh counter configured to count a row address for performing an auto-refresh operation on unit cells in said another group in response to an auto-refresh command during the normal operation, and configured to count the row address in response to the output of the test pattern generator during the BISS test.

5. The semiconductor memory device as recited in claim 1, wherein the test control signal comprises a pattern test enable signal for performing the BISS test, a first pattern test signal for performing a test depending on a row-march pattern, and a second pattern test signal for performing a test depending on a column-page pattern; and
- the test pattern generator outputs a command control signal controlling the plurality of internal operations and an address control signal controlling a row address, a column address, and a bank address, to control the row-march pattern and the column-page pattern in response to the first or second pattern test signal.

6. The semiconductor memory device as recited in claim 5, wherein the test pattern generator comprises:
- a pulse generation unit configured to generate the command control signal, a row address increment signal controlling the row address, and a plurality of pulses in response to the first or second pattern test signal;
- a column address increment signal generation unit configured to select one or more pulses from the plurality of pulses to generate a column address increment signal controlling the column address in response to the first or second pattern test signal; and
- a bank address increment signal generation unit configured to select another one or more pulse of the plurality of pulses to generate a bank address increment signal controlling the column address in response to the first or second pattern test signal.

7. The semiconductor memory device as recited in claim 6, wherein the pulse generation unit sequentially activates a row address enable signal, an active enable signal for enabling an active operation, a column address activation signal for enabling the column address, a write enable signal for enabling the write operation, a precharge address enable signal for enabling an address to carry out a precharge operation, a precharge enable signal for enabling the precharge operation, and the row address increment signal for increasing the row address.

8. The semiconductor memory device as recited in claim 7, wherein:
- the column address increment signal generation unit repeatedly increases the column address increment signal until a column address reset signal output from the second refresh controller is activated before the pulse generation unit activates the row address increment signal, when the first pattern test signal is activated; and
- the column address increment signal generation unit increases the column address increment signal when a column address reset signal output from the first refresh controller is activated by the pulse generation unit repeatedly activating the row address increment signal, when the second pattern test signal is activated.

9. The semiconductor memory device as recited in claim 7, wherein the bank address increment signal generation unit increases the bank address signal in response to a row address reset signal and a column address reset signal output from the first and second refresh controllers, when the first or second pattern test signal is activated.

10. The semiconductor memory device as recited in claim 5, wherein the test command address generator comprises:
- a command generation unit configured to decode the command control signal output from the test pattern generator to generate a test internal command;
- a data generation unit configured to generate test data using the address control signal; and
- an address generation unit configured to selectively transfer the row address, the column address, and the bank address output from the first and second refresh controllers.

11. The semiconductor memory device as recited in claim 1, further comprising:
- a clock buffer configured to stop transferring a clock signal applied from outside the semiconductor device when a test is initiated at the wafer-level, and configured to transfer the clock signal as an internal test clock when the BISS test is performed;
- a command buffer configured to transfer a command control signal applied from outside the semiconductor device when a test is initiated at the wafer-level, and configured to transfer an internal test command output from the test command address generator when the BISS test is performed;
- an address buffer configured to transfer an address signal applied from outside the semiconductor device when a test is initiated at the wafer-level, and configured to transfer an internal address signal output from the test command address generator when the BISS test is performed; and
- a data buffer configured to transfer data applied from outside the semiconductor device when a test is initiated at the wafer-level, and configured to transfer test data output from the test command address generator when the BISS test is performed.

12. The semiconductor memory device as recited in claim 11, wherein the test circuit further comprises:

a mode generator configured to determine whether to perform a test at the wafer-level based on a signal applied from outside the semiconductor device;

a first enabler configured to enable the command buffer and the clock buffer in response to an output of the mode generator;

a second enabler configured to enable the address buffer in response to an output of the first enabler; and a test address buffer configured to buffer signals input via the plurality address pads.

* * * * *